(12) United States Patent
Kawaguchi et al.

(10) Patent No.: US 12,142,483 B2
(45) Date of Patent: Nov. 12, 2024

(54) SUBSTRATE PROCESSING APPARATUS AND SUBSTRATE PROCESSING METHOD

(71) Applicant: Tokyo Electron Limited, Tokyo (JP)

(72) Inventors: Yoshihiro Kawaguchi, Kumamoto (JP); Seiji Nakano, Kumamoto (JP); Munehisa Kodama, Kumamoto (JP); Hirotoshi Mori, Kumamoto (JP); Hayato Tanoue, Kumamoto (JP); Yohei Yamawaki, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 576 days.

(21) Appl. No.: 17/295,480

(22) PCT Filed: Nov. 11, 2019

(86) PCT No.: PCT/JP2019/044082
§ 371 (c)(1),
(2) Date: May 20, 2021

(87) PCT Pub. No.: WO2020/105483
PCT Pub. Date: May 28, 2020

(65) Prior Publication Data

US 2021/0391177 A1     Dec. 16, 2021

(30) Foreign Application Priority Data

Nov. 21, 2018 (JP) .................. 2018-218567
Feb. 27, 2019 (JP) .................. 2019-034954

(51) Int. Cl.
*H01L 21/304* (2006.01)
*B24B 7/22* (2006.01)
*H01L 21/683* (2006.01)

(52) U.S. Cl.
CPC ............ *H01L 21/304* (2013.01); *B24B 7/228* (2013.01); *H01L 21/683* (2013.01)

(58) Field of Classification Search
CPC ................ H01L 21/304; H01L 21/683; H01L 21/67092; H01L 21/67253;
(Continued)

(56) References Cited

U.S. PATENT DOCUMENTS 7,384,859 B2 * 6/2008 Watanabe ......... H01L 21/67092
257/E21.599
2013/0062020 A1 * 3/2013 Ries .................. H01L 21/67092
156/760

(Continued)

FOREIGN PATENT DOCUMENTS

JP     H9-216152 A     8/1997
JP     H10254146 A     9/1998
(Continued)

OTHER PUBLICATIONS

Machine translation of KR20130026810 (Year: 2013).*
International Search Report of PCT/JP2019/044082 dated Dec. 10, 2019.

*Primary Examiner* — Robert F Neibaur
(74) *Attorney, Agent, or Firm* — Shih IP Law Group, PLLC.

(57) ABSTRACT

A substrate processing apparatus configured to process a substrate includes a substrate holder configured to hold, in a combined substrate in which a first substrate and a second substrate are bonded to each other, the second substrate; a periphery removing unit configured to remove, starting from a periphery modification layer formed on the first substrate along a boundary between a peripheral portion to be removed and a central portion of the first substrate, the peripheral portion from the combined substrate held by the substrate holder; and a collection unit equipped with a collection mechanism configured to collect the peripheral portion removed by the periphery removing unit.

19 Claims, 29 Drawing Sheets

(58) Field of Classification Search
CPC ......... H01L 21/68764; H01L 21/67259; B24B 7/228; B24B 7/04; B24B 49/12; B24B 55/06; B24B 37/10; B24B 9/065; B23K 26/38; B23K 26/08; B23K 26/067; B23K 26/0622; B23K 26/044; B23K 103/00
USPC ...... 451/6, 41, 283, 285, 290, 367, 374, 379
See application file for complete search history.

(56) References Cited

U.S. PATENT DOCUMENTS

| | | | | |
|---|---|---|---|---|
| 2014/0251546 | A1* | 9/2014 | Deguchi | ............. B32B 38/1858 |
| | | | | 156/702 |
| 2015/0332911 | A1* | 11/2015 | Priewasser | .......... B32B 38/0004 |
| | | | | 156/154 |

FOREIGN PATENT DOCUMENTS

| | | |
|---|---|---|
| JP | 2000-114192 A | 4/2000 |
| JP | 2003078117 A | 3/2003 |
| JP | 2004-111606 A | 4/2004 |
| JP | 2006-066643 A | 3/2006 |
| JP | 2007-319893 A | 12/2007 |
| JP | 2013098246 A | 5/2013 |
| JP | 2014-054694 A | 3/2014 |
| JP | 2014079860 A | 5/2014 |
| JP | 2015023239 A | 2/2015 |
| JP | 2015050402 A | 3/2015 |
| JP | 2016130738 A | 7/2016 |
| KR | 102013 0026810 A | 3/2013 |

* cited by examiner

FIG. 4
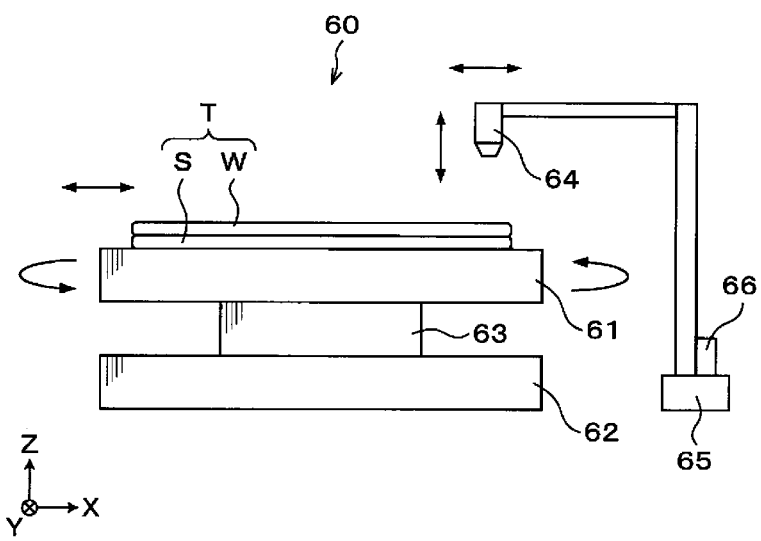
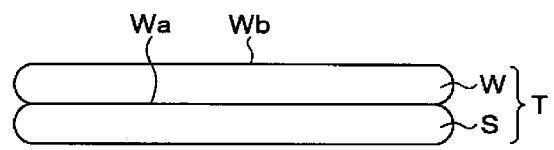
FIG. 5A
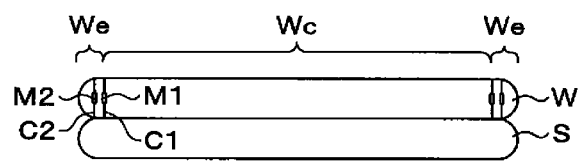
FIG. 5B
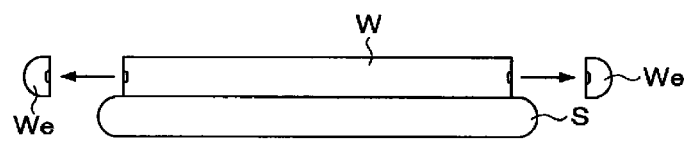
FIG. 5C
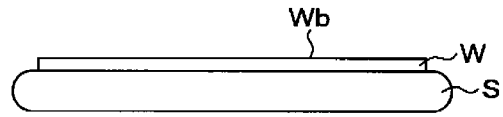
FIG. 5D

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2019/044082 filed on Nov. 11, 2019, which claims the benefit of Japanese Patent Application Nos. 2018-218567 and 2019-034954 filed on Nov. 21, 2018 and Feb. 27, 2019, respectively, the entire disclosures of which are incorporated herein by reference.

TECHNICAL FIELD

The various aspects and exemplary embodiments described herein pertain generally to a substrate processing apparatus and a substrate processing method.

BACKGROUND

Patent Document 1 discloses that a disk-shaped grinding tool provided with abrasive grains on its outer peripheral portion is rotated and at least an outer circumferential surface of the grinding tool is linearly contacted with a semiconductor wafer to grind a circumferential end portion of the semiconductor wafer into a substantially L-shape. The semiconductor wafer is fabricated by bonding two silicon wafers together.

PRIOR ART DOCUMENT

Patent Document 1: Japanese Patent Laid-open Publication No. H09-216152

Disclosure of the Invention

Means for Solving the Problems

In one exemplary embodiment, a substrate processing apparatus configured to process a substrate includes a substrate holder configured to hold, in a combined substrate in which a first substrate and a second substrate are bonded to each other, the second substrate; a periphery removing unit configured to remove, starting from a periphery modification layer formed on the first substrate along a boundary between a peripheral portion to be removed and a central portion of the first substrate, the peripheral portion from the combined substrate held by the substrate holder; and a collection unit equipped with a collection mechanism configured to collect the peripheral portion removed by the periphery removing unit.

BRIEF DESCRIPTION OF THE DRAWINGS

FIG. 4 is a side view illustrating an example configuration of a modifying device.

FIG. 5A to FIG. 5D are explanatory diagrams illustrating major processes of a wafer processing.

DETAILED DESCRIPTION

Figure 1:
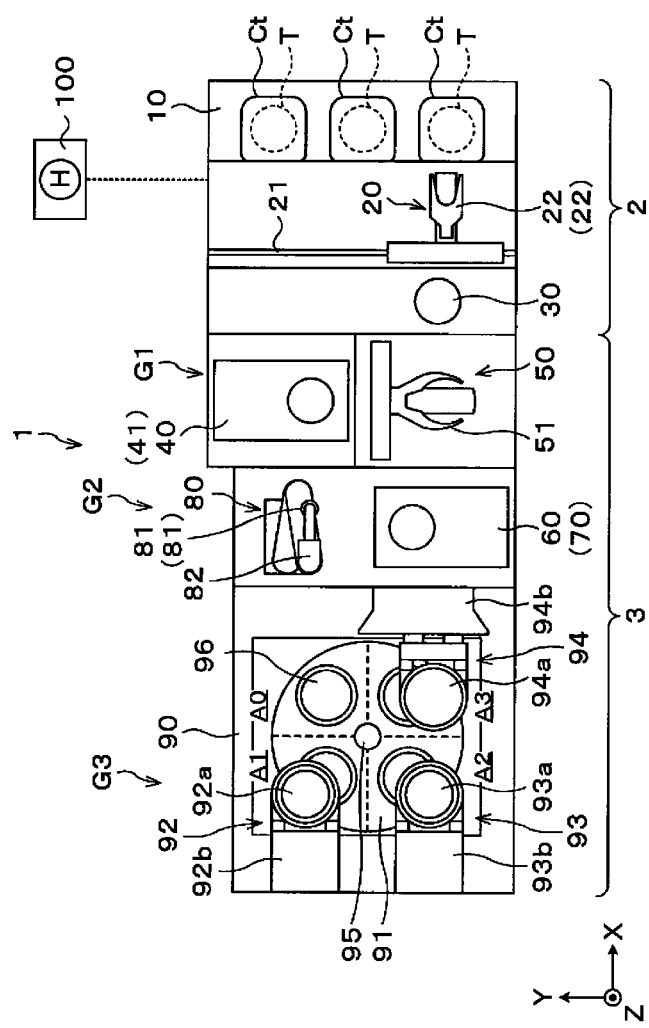
FIG. 1 is a schematic plan view illustrating an example configuration of a wafer processing system according to an exemplary embodiment.

In a manufacturing process for a semiconductor device, a wafer having devices such as a plurality of electronic circuits formed on a front surface thereof is thinned by grinding a rear surface of the wafer. If this thinned wafer is transferred or subjected to a subsequent processing as it is, warpage or break can occur in the wafer. Therefore, in order to reinforce the wafer, bonding the wafer to a support board is performed.

Typically, a peripheral portion of the wafer is chamfered. If, however, the wafer is ground as stated above, the peripheral portion of the wafer is given a sharp pointed shape (so-called knife edge shape). If so, chipping occurs at the peripheral portion of the wafer and the wafer may be damaged. Therefore, a so-called edge trim for removing the peripheral portion of the wafer is performed prior to the grinding processing.

The end surface grinding device described in Patent Document 1 is a device configured to perform the edge trim. However, in this end surface grinding device, the edge trim is performed by grinding, and, thus, a large amount of grinding water is used and a sewage treatment device is also needed. Further, in the edge trim by grinding, a whetstone is used and needs to be replaced regularly, which requires a running cost.

According to the technique of the present disclosure, the edge trim is appropriately performed. Hereinafter, a wafer processing system as a substrate processing apparatus according to the present exemplary embodiment that performs the edge trim appropriately, and a wafer processing method as a substrate processing method will be described with reference to the accompanying drawings. In the specification and the drawings, parts having substantially same functions and configurations will be assigned same reference numerals, and redundant description thereof will be omitted.

First, the configuration of a wafer processing system according to the present exemplary embodiment will be described with reference to the accompanying drawings.

Figure 2:
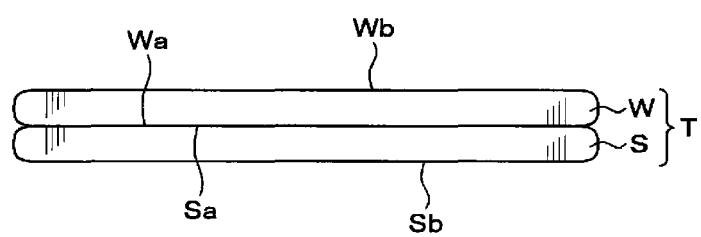
FIG. 2 is a side view illustrating an example configuration of a combined wafer.
Figure 3:
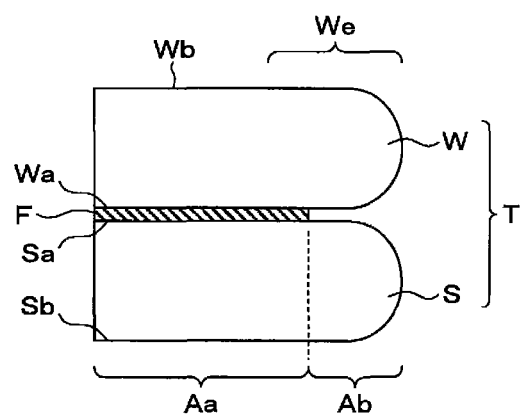
FIG. 3 is a side view illustrating an example configuration of a part of the combined wafer.

In a wafer processing system 1, a predetermined processing is performed on a combined wafer T, which is prepared as a combined substrate by bonding a processing target wafer W as a first substrate and a support wafer S as a second substrate, as shown in FIG. 2 and FIG. 3. Further, in the wafer processing system 1, a peripheral portion We of the processing target wafer W is removed and the processing target wafer W is thinned. Hereinafter, in the processing target wafer W, a surface bonded to the support wafer S will be referred to as "front surface Wa", and a surface opposite to the front surface Wa will be referred to as "rear surface Wb". Further, in the support wafer S, a surface bonded to the processing target wafer W will be referred to as "front surface Sa", and a surface opposite to the front surface Sa will be referred to as "rear surface Sb".

The processing target wafer W is a semiconductor wafer such as a silicon wafer, and a device layer (not shown) including a plurality of devices is formed on the front surface Wa. An oxide film F, for example, $SiO_2$ film (TEOS film) is further formed on the device layer. Also, the peripheral portion We of the processing target wafer W is chamfered, and, thus, the thickness of the peripheral portion We decreases toward the tip end on a cross section thereof.

Further, in FIG. 2, illustration of the oxide film F is omitted, for avoiding the complexity of FIG. 2. Likewise, illustration of the oxide film F may also be omitted in the other drawings used in the following description.

The support wafer S is a wafer configured to support the processing target wafer W, and is, for example, a silicon wafer. An oxide film (not shown) is formed on the front surface Sa of the support wafer S. Further, the support wafer S serves as a protection member which protects the devices on the front surface Wa of the processing target wafer W. Furthermore, if the support wafer S has a plurality of devices formed on the front surface Sa, a device layer (not shown) is formed on the front surface Sa as in the processing target wafer W.

Here, if the processing target wafer W and the support wafer S are bonded to each other at the peripheral portion We of the processing target wafer W, the peripheral portion We may not be appropriately removed. Therefore, at the interface between the processing target wafer W and the support wafer S, a bonding region Aa where the oxide film F and the front surface Sa of the support wafer S are bonded and a non-bonding region Ab located radially outside the bonding region Aa are formed. Due to the non-bonding region Ab, the peripheral portion We can be appropriately removed. Although details will be described later, it is desirable that an outer end portion of the bonding region Aa should be located slightly radially outside an inner end portion of the peripheral portion We to be removed.

As depicted in FIG. 1, the wafer processing system 1 is equipped with a carry-in/out station 2 and a processing station 3 which are connected as one body. A cassette Ct which can accommodate a plurality of combined wafers T is carried in/out between the carry-in/out station 2 and, for example, the outside. The processing station 3 includes various processing devices that perform predetermined processings on the combined wafer T.

In the carry-in/out station 2, a cassette mounting table 10 is provided. In the illustrated example, a plurality of, for example, three cassettes Ct can be arranged in a row in a Y-axis direction on the cassette mounting table 10. Further, the number of cassettes Ct arranged on the cassette mounting table 10 is not limited to the present exemplary embodiment, but can be arbitrarily determined.

In the carry-in/out station 2, a wafer transfer device 20 is provided adjacent to the cassette mounting table 10 at a negative X-axis side of the cassette mounting table 10. The wafer transfer device 20 is configured to be movable on a transfer path 21 elongated in a Y-axis direction. Further, the wafer transfer device 20 has, for example, two transfer arms 22 and 22 configured to hold and transfer the combined wafer T. Each transfer arm 22 is movable in a horizontal direction, in a vertical direction, around a horizontal axis and around a vertical axis. Also, the configuration of the transfer arm 22 is not limited to the present exemplary embodiment, but can be arbitrarily determined. Further, the wafer transfer device 20 is configured to transfer the combined wafer T to the cassette Ct of the cassette mounting table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is equipped with, for example, three processing blocks G1 to G3. The first processing block G1, the second processing block G2 and the third processing block G3 are arranged in this order from a positive X-axis side (the carry-in/out station 2 side) to a negative X-axis side of the processing station 3.

The first processing block G1 is provided with an etching device 40, a cleaning device 41, and a wafer transfer device 50. The etching device 40 and the cleaning device 41 are arranged in layers. Further, the number and arrangement of etching devices 40 and cleaning devices 41 are not limited thereto. For example, the etching device 40 and the cleaning device 41 may be elongated in the X-axis direction and arranged parallel to each other when viewed from the top. Further, each of the etching device 40 and the cleaning device 41 may be arranged in layers.

The etching device 40 etches the rear surface Wb of the processing target wafer W ground by a processing device 90 to be described later. For example, a chemical solution (etching solution) is supplied onto the rear surface Wb to wet etch the rear surface Wb. For example, HF, $HNO_3$, $H_3PO_4$, TMAH, Choline, KOH or the like is used as the chemical solution. If the rear surface Wb is sufficiently cleaned by the cleaning device 41, the etching device 40 may be omitted.

The cleaning device 41 cleans the rear surface Wb of the processing target wafer W ground by the processing device 90 to be described later. For example, a brush is brought into contact with the rear surface Wb to scrub-clean the rear surface Wb. Further, a pressurized cleaning solution may be used for cleaning the rear surface Wb. The cleaning device 41 may have a configuration for cleaning the rear surface Sb of the support wafer S together with the rear surface Wb of the processing target wafer W.

The wafer transfer device 50 is arranged, for example, at a negative Y-axis side of the etching device 40 and the cleaning device 41. The wafer transfer device 50 has, for example, two transfer arms 51 and 51 configured to hold and transfer the combined wafer T. Each transfer arm 51 is configured to be movable in the horizontal direction, in the vertical direction, around the horizontal axis and around the vertical axis. Also, the configuration of the transfer arm 51 is not limited to the present exemplary embodiment, but can be arbitrarily determined. The wafer transfer device 50 is configured to transfer the combined wafer T to the transition device 30, the etching device 40, the cleaning device 41, and a modifying device 60 to be described later.

The second processing block G2 is equipped with the modifying device 60, a periphery removing device 70 and a wafer transfer device 80. The modifying device 60 and the periphery removing device 70 are arranged in layers. The number and arrangement of modifying devices 60 and periphery removing devices 70 are not limited thereto.

The modifying device 60 radiates a laser beam into the processing target wafer W to form a periphery modification layer and a divided modification layer. As shown in FIG. 4, the modifying device 60 has a chuck 61 configured to hold the combined wafer T including the processing target wafer W on the upper side and the support wafer S on the lower side. The chuck 61 is configured to be movable in the X-axis direction and the Y-axis direction by a moving mechanism 62. The moving mechanism 62 is configured as a general precision XY stage. Further, the chuck 61 is configured to be rotatable about the vertical axis by a rotating mechanism 63.

A laser head 64 configured to radiate a laser beam into the processing target wafer W is provided above the chuck 61. The laser head 64 focuses a high frequency pulsed laser beam oscillated from a laser beam oscillator (not shown), i.e., a laser beam having a wavelength transmissive to the processing target wafer W, e.g., an infrared beam, to a predetermined position inside the processing target wafer W. Thus, in the processing target wafer W, a portion where the laser beam is focused is modified. The laser head 64 may be configured to be movable in the X-axis direction and in the Y-axis direction by a moving mechanism 65. The moving mechanism 65 is configured as a general precision XY stage. Further, the laser head 64 may be configured to be movable in a Z-axis direction by an elevating mechanism 66.

The periphery removing device 70 removes, starting from the periphery modification layer formed by the modifying device 60, the peripheral portion We of the processing target wafer W. The specific configuration of the periphery removing device 70 will be described later.

The wafer transfer device 80 is arranged, for example, at a positive Y axis side of the modifying device 60 and the periphery removing device 70. The wafer transfer device 80 has, for example, two transfer arms 81 and 81 configured to hold and transfer the combined wafer T. Each transfer arm 81 is supported by a multi-joint arm member 82 and configured to be movable in the horizontal direction, in the vertical direction, around the horizontal axis and around the vertical axis. The configuration of the transfer arm 81 is not limited to the present exemplary embodiment, but can be arbitrarily determined. The wafer transfer device 80 is configured to transfer the combined wafer T to the cleaning device 41, the modifying device 60, the periphery removing device 70, and the processing device 90 to be described later.

The third processing block G3 is equipped with the processing device 90. The number and arrangement of processing devices 90 are not limited to the present exemplary embodiment, and a plurality of processing devices 90 may be arranged arbitrarily.

The processing device 90 grinds the rear surface Wb of the processing target wafer W. The processing device 90 is equipped with a turntable 91, a rough grinding unit 92, an intermediate grinding unit 93 and a finish grinding unit 94.

The turntable 91 is configured to be rotatable around a rotational center line 95 by a rotating mechanism (not shown). Four chucks 96 configured to suction and hold the combined wafer T are provided on the turntable 91. The chucks 96 are arranged concentrically with the turntable 91 at the same angular interval, i.e., every 90 degrees. The four chucks 96 are configured to be movable to a delivery position A0 and processing positions A1 to A3 when the turntable 91 is rotated. Also, each of the four chucks 96 is configured to be rotatable around the vertical axis by a rotating mechanism (not shown).

In the present exemplary embodiment, the delivery position A0 refers to a position at a positive X-axis side and a positive Y-axis side of the turntable 91, and the combined wafer T is delivered at the delivery position A0. The first processing position A1 refers to a position at a negative X-axis side and the positive Y-axis side of the turntable 91, and the rough grinding unit 92 is placed at the first processing position A1. The second processing position A2 refers to a position at the negative X-axis side and a negative Y-axis side of the turntable 91, and the intermediate grinding unit 93 is placed at the second processing position A2. The third processing position A3 refers to a position at the positive X-axis side and the negative Y-axis side of the turntable 91, and the finish grinding unit 94 is placed at the third processing position A3.

In the rough grinding unit 92, rough grinding is performed on the rear surface Wb of the processing target wafer W. The rough grinding unit 92 has a rough grinder 92a equipped with an annular rough grinding whetstone (not shown) which is rotatable. Also, the rough grinder 92a is configured to be movable in the vertical direction along a column 92b. Further, in a state where the rear surface Wb of the processing target wafer W held on the chuck 96 is in contact with the rough grinding whetstone, each of the chuck 96 and the rough grinding whetstone is rotated to perform rough grinding on the rear surface Wb.

In the intermediate grinding unit 93, intermediate grinding is performed on the rear surface Wb of the processing target wafer W. The intermediate grinding unit 93 has an intermediate grinder 93a equipped with an annular intermediate grinding whetstone (not shown) which is rotatable. Also, the intermediate grinder 93a is configured to be movable in the vertical direction along a column 93b. Further, the intermediate grinding whetstone has a smaller particle size than the rough grinding whetstone. Furthermore, in a state where the rear surface Wb of the processing target wafer W held on the chuck 96 is in contact with the intermediate grinding whetstone, each of the chuck 96 and the intermediate grinding whetstone is rotated to perform intermediate grinding on the rear surface Wb.

In the finish grinding unit 94, finish grinding is performed on the rear surface Wb of the processing target wafer W. The finish grinding unit 94 has a finish grinder 94a equipped with an annular finish grinding whetstone (not shown) which is rotatable. Also, the finish grinder 94a is configured to be movable in the vertical direction along a column 94b. Further, the finish grinding whetstone has a smaller particle size than the intermediate grinding whetstone. Furthermore, in a state where the rear surface Wb of the processing target wafer W held on the chuck 96 is in contact with the finish grinding whetstone, each of the chuck 96 and the finish grinding whetstone is rotated to perform finish grinding on the rear surface Wb.

The above-described wafer processing system 1 is equipped with a control device 100. The control device 100 is, for example, a computer and has a program storage unit (not shown). The program storage unit stores a program that controls a processing of the combined wafer T in the wafer processing system 1. The program storage unit also stores a program that controls operations of a driving system, such as the above-described various processing devices and transfer devices, to implement the following substrate processing in the wafer processing system 1. Also, the program may be stored in a computer-readable storage medium H and installed from the storage medium H into the control device 100.

Hereinafter, a wafer processing to be performed using the wafer processing system 1 configured as described above will be described with reference to the accompanying drawings. Further, in the present exemplary embodiment, the combined wafer T is formed in advance by bonding the processing target wafer W and the support wafer S to each other in a bonding apparatus (not shown) outside the wafer processing system 1.

First, the cassette Ct accommodating a plurality of combined wafers T shown in FIG. 5A is placed on the cassette mounting table 10 of the carry-in/out station 2.

Then, a combined wafer T in the cassette Ct is taken out by the wafer transfer device 20 and transferred to the transition device 30. Subsequently, the wafer transfer device 50 takes out the combined wafer T of the transition device 30 and transfers it to the modifying device 60. In the modifying device 60, as shown in FIG. 5B, a periphery modification layer M1 is formed inside the processing target wafer W (process P1 in FIG. 6) and the divided modification layer M2 is formed (process P2 in FIG. 6).

Figure 7:
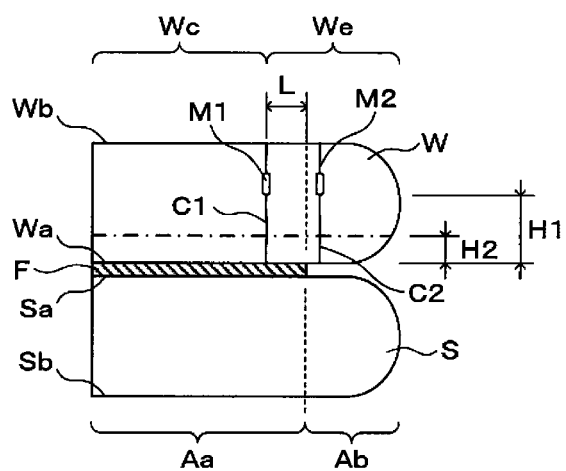
FIG. 7 is a longitudinal cross sectional view illustrating a state in which a periphery modification layer and a divided modification layer are formed on a processing target wafer.
Figure 8:
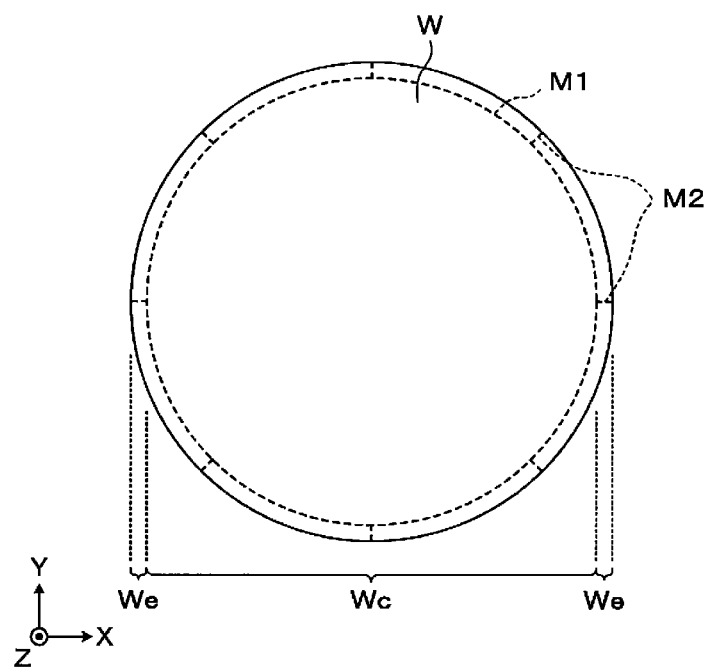
FIG. 8 is a plan view illustrating a state in which the periphery modification layer and the divided modification layer are formed on a processing target wafer.

In the modifying device 60, the combined wafer T is transferred to and held by the chuck 61. Thereafter, while the processing target wafer W (combined wafer T) is rotated, a laser beam is radiated from the laser head 64 to form the periphery modification layer M1 at the boundary between the peripheral portion We and the central portion Wc of the processing target wafer W (process P1 in FIG. 6). The periphery modification layer M1 serves as a starting point when the peripheral portion We is removed during an edge trim, and as shown in FIG. 7 and FIG. 8, the periphery modification layer M1 is annularly formed along the boundary between the peripheral portion We to be removed and the central portion Wc of the processing target wafer W. Further, the peripheral portion We is, for example, in the range of 1 mm to 5 mm in a diametrical direction from an outer end portion of the processing target wafer W, and includes a chamfered portion.

Further, the periphery modification layer M1 is formed diametrically inside the outer end portion of the bonding region Aa. When the periphery modification layer M1 is formed using a laser beam from the laser head, even if the periphery modification layer M1 is formed deviating from the outer end portion of the bonding region Aa due to, for example, a processing error, it is possible to suppress the diametrically outward formation of the periphery modification layer M1 from the outer end portion of the bonding region Aa. Here, if the periphery modification layer M1 is formed diametrically outwards from the outer end portion of the bonding region Aa, the processing target wafer W floats above the support wafer S after the peripheral portion We is removed. In this regard, in the present exemplary embodiment, it is possible to reliably suppress the processing target wafer W not to be put into a floating state.

As a result of intensive studies conducted by the present inventors, it is found that if a distance L between the periphery modification layer M1 and the outer end portion of the bonding region Aa is sufficiently small, the peripheral portion We can be appropriately removed. The distance L is desirably less than 500 μm, more desirably less than 50 μm.

Also, the periphery modification layer M1 is elongated in a thickness direction and has a vertically long aspect ratio. A lower end of the periphery modification layer M1 is located above a target surface (dotted line in FIG. 7) of the processing target wafer W after grinding. That is, a distance H1 between the lower end of the periphery modification layer M1 and the front surface Wa of the processing target wafer W is larger than a target thickness H2 of the processing target wafer W after grinding. In this case, the periphery modification layer M1 does not remain on the processing target wafer W after grinding.

Furthermore, inside the processing target wafer W, a crack C1 develops from the periphery modification layer M1 and reaches the front surface Wa and the rear surface Wb. A plurality of periphery modification layers M1 may also be formed in the thickness direction.

Figure 6:
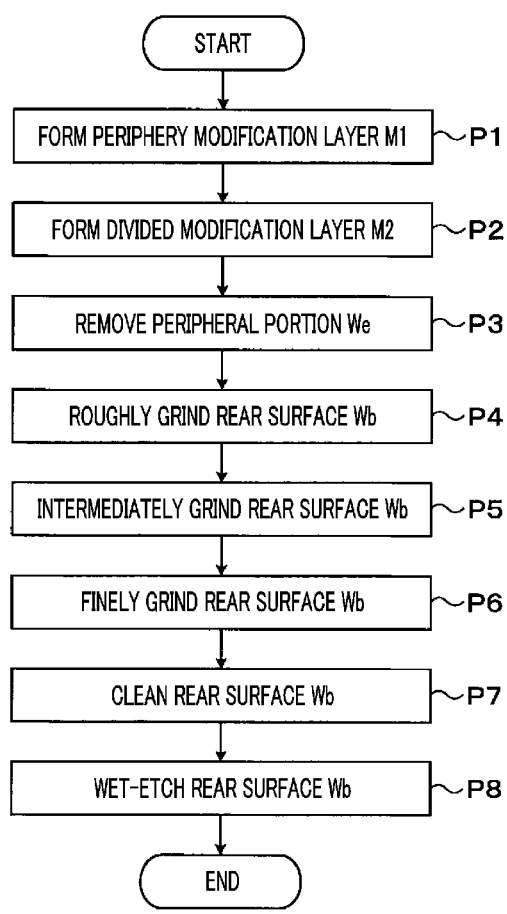
FIG. 6 is a flowchart illustrating major processes of the wafer processing.

Then, in the same modifying device 60, the laser head is moved to form the divided modification layer M2 inside the processing target wafer W and diametrically outside the periphery modification layer M1 as shown in FIG. 8 (process P2 in FIG. 6). Similarly to the periphery modification layer M1, the divided modification layer M2 is also elongated in the thickness direction and has a vertically long aspect ratio. Further, a crack C2 develops from the divided modification layer M2 and reaches the front surface Wa and the rear surface Wb. A plurality of divided modification layers M2 may also be formed in the thickness direction.

Then, by forming a plurality of divided modification layers M2 and a plurality of cracks C2 in the diametrical direction at a pitch of several μm, a divided modification layer M2 is formed in a line elongated diametrically outwards from the periphery modification layer M1 as shown in FIG. 8. In the illustrated example, the divided modification layer M2 in a line elongated diametrically is formed in eight places, but the number of divided modification layers M2 is arbitrarily determined. If the divided modification layer M2 is formed in at least two places, the peripheral portion We can be removed. In this case, when the peripheral portion We is removed during an edge trim, the peripheral portion We is divided, starting from the annular periphery modification layer M1, into a plurality of fragments by the divided modification layer M2. Then, the peripheral portion We to be removed is fragmented and thus can be removed more easily.

Then, the combined wafer T is transferred into the periphery removing device 70 by the wafer transfer device 80. In the periphery removing device 70, as shown in FIG. 5C, the peripheral portion We of the processing target wafer W is removed starting from the periphery modification layer M1 (process P3 in FIG. 6). Here, the peripheral portion We is fragmented starting from the divided modification layer M2.

Then, the combined wafer T is transferred into the processing device 90 by the wafer transfer device 80. The combined wafer T transferred into the processing device 90 is delivered to the chuck 96 located at the delivery position A0. Thereafter, the chuck 96 is moved to the first processing position A1. Then, rough grinding is performed on the rear surface Wb of the processing target wafer W by the rough grinding unit 92 (process P4 in FIG. 6) as shown in FIG. 5D.

Then, the chuck 96 is moved to the second processing position A2. Thereafter, intermediate grinding is performed on the rear surface Wb of the processing target wafer W by the intermediate grinding unit 93 (process P5 in FIG. 6).

Then, the chuck 96 is moved to the third processing position A3. Thereafter, finish grinding is performed on the rear surface Wb of the processing target wafer W by the finish grinding unit 94 (process P6 in FIG. 6).

Then, the chuck 96 is moved to the delivery position A0. At the delivery position A0, the rear surface Wb of the processing target wafer W may be cleaned with a cleaning solution by using a cleaning solution nozzle (not shown).

Then, the combined wafer T is transferred into the cleaning device 41 by the wafer transfer device 80. In the cleaning device 41, the rear surface Wb, which is a grinding surface of the processing target wafer W, is scrub-cleaned (process P7 in FIG. 6). In the cleaning device 41, the rear surface Sb of the support wafer S may be cleaned together with the rear surface Wb of the processing target wafer W.

Thereafter, the combined wafer T is transferred into the etching device 40 by the wafer transfer device 50. In the etching device 40, the rear surface Wb of the processing target wafer W is wet etched with a chemical solution (process P8 in FIG. 6). A grinding mark may be formed on the rear surface Wb ground by the above-described processing device 90. In the present process P8, the grinding mark can be removed by wet etching, and, thus, the rear surface Wb can be smoothed.

Thereafter, the combined wafer T which has undergone all the processings is transferred into the transition device 30 by the wafer transfer device 50 and then transferred to the cassette Ct of the cassette mounting table 10 by the wafer transfer device 20. In this way, a series of processings in the wafer processing system 1 are ended.

Hereinafter, the periphery removing device 70 will be described in detail.

Figure 9:
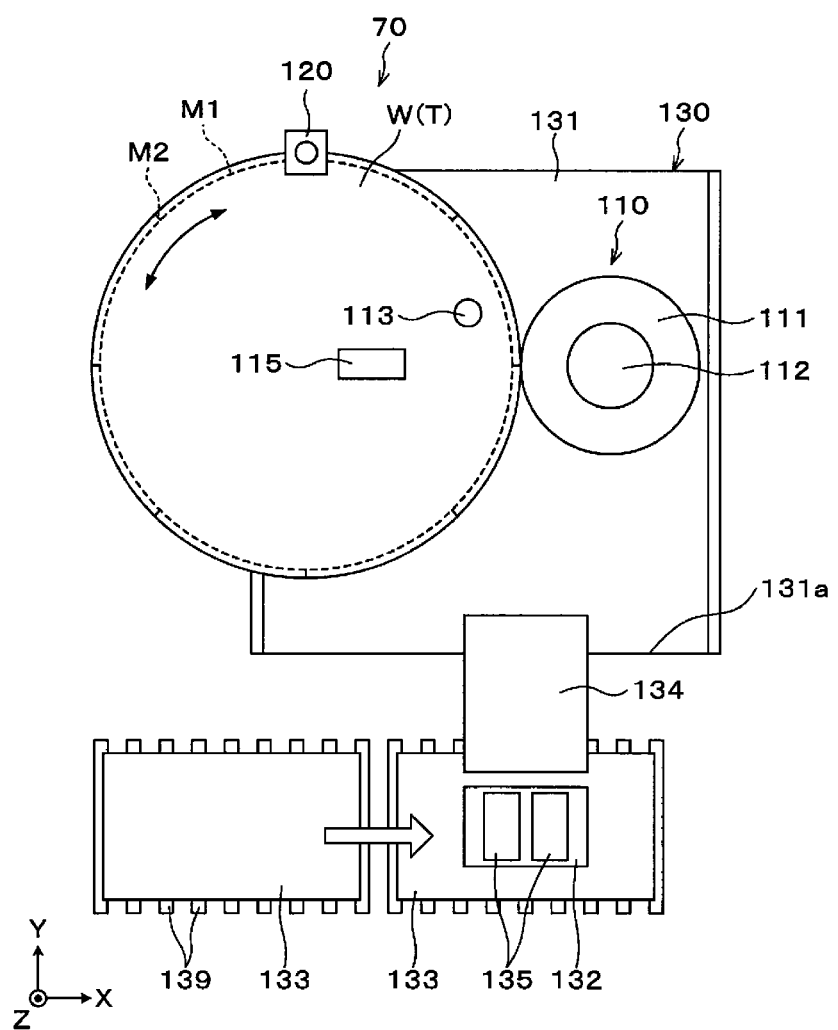
FIG. 9 is a plan view illustrating an example configuration of a periphery removing device.
Figure 10:
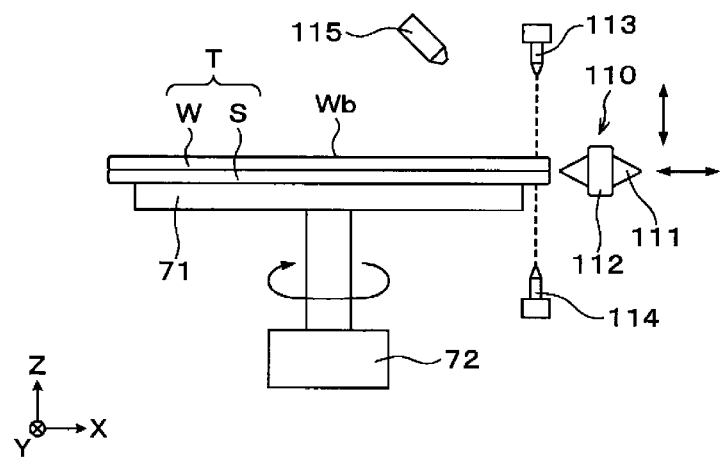
FIG. 10 is a side view illustrating an example configuration of the periphery removing device.
Figure 11:
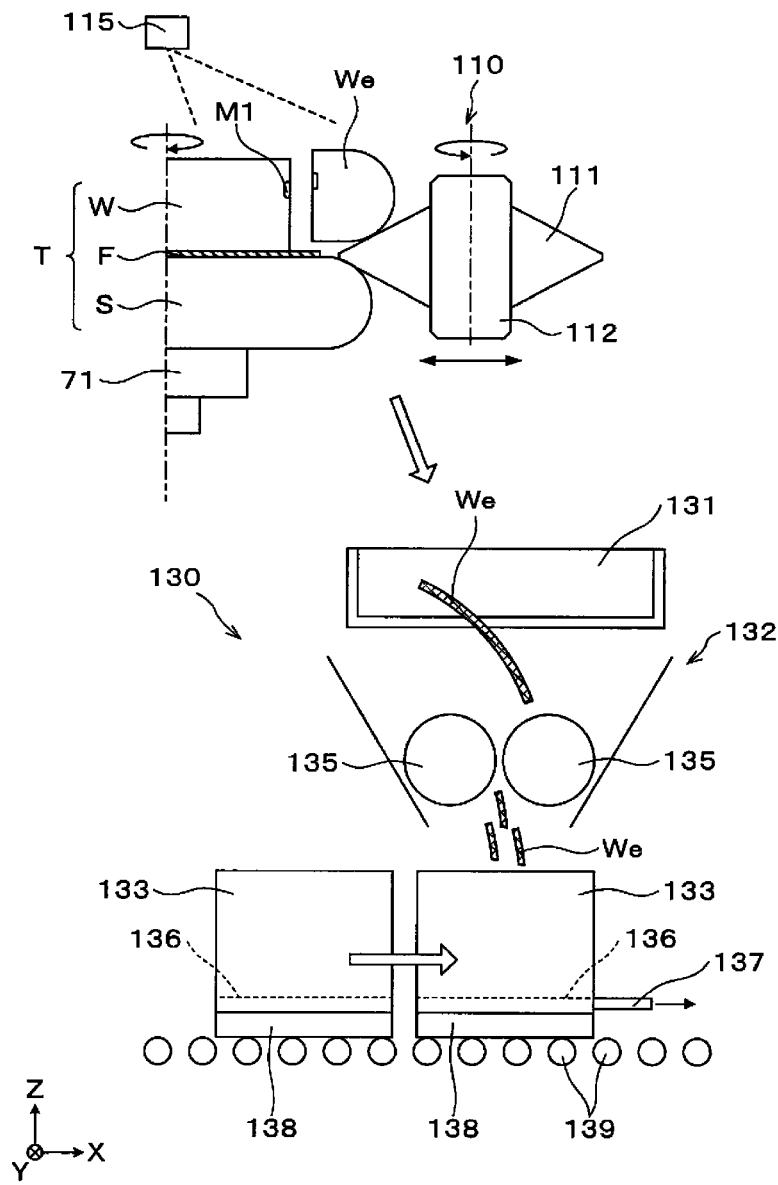
FIG. 11 is an explanatory diagram schematically illustrating an example configuration of the periphery removing device.

As shown in FIG. 9, FIG. 10 and FIG. 11, the periphery removing device 70 has a chuck 71 that serves as a substrate holder configured to hold the combined wafer T on an upper surface thereof. The chuck 71 holds the support wafer S in a state where the processing target wafer W is on the upper side and the support wafer S is on the lower side. The chuck 71 is configured to be rotatable around the vertical axis by a rotating mechanism 72.

A periphery removing unit 110 configured to remove the peripheral portion We of the processing target wafer W is provided on the side of the chuck 71. The periphery removing unit 110 applies an impact to the peripheral portion We to remove the peripheral portion We. The periphery removing unit 110 has a wedge roller 111 as an insertion member and a support roller 112.

The wedge roller 111 has a wedge shape with a sharp pointed tip when viewed from the side. The wedge roller 111 is inserted into the interface between the processing target wafer W and the support wafer S from outer end portions of the processing target wafer W and the support wafer S. Then, the peripheral portion We is pushed up by the inserted wedge roller 111 to be separated and removed from the processing target wafer W.

The support roller 112 penetrates the center of the wedge roller 111 and supports the wedge roller 111. The support roller 112 is configured to be movable in the horizontal direction by a moving mechanism (not shown), and when the support roller 112 moves, the wedge roller 111 also moves. Further, the support roller 112 is configured to be rotatable around the vertical axis, and the wedge roller 111 also rotates when the support roller 112 rotates. In the present exemplary embodiment, as will be described later, a so-called free roller that rotates in response to rotation of the chuck 71 is used as the support roller 112. However, the support roller 112 may be actively rotated by a rotating mechanism (not shown).

Although the wedge roller 111 is used as the insertion member in the present exemplary embodiment, the insertion member is not limited thereto. For example, the insertion member just needs to have a shape in which the width decreases diametrically outwards when viewed from the side, and a knife-shaped insertion member having a sharp pointed tip may be used.

Nozzles 113 and 114 as a fluid supply configured to supply a fluid (for example, a cleaning solution or air) to the processing target wafer W are provided above and below the chuck 71, respectively. For example, pure water is used as the cleaning solution. When an impact is applied to the peripheral portion We using the periphery removing unit 110 to remove the peripheral portion We, dust (particles) is generated. Therefore, in the present exemplary embodiment, by supplying the fluid from the nozzles 113 and 114, it is possible to suppress the scattering of dust. Hereinafter, a case where the fluid is a cleaning solution will be described as an example.

The upper nozzle 113 is arranged above the chuck 71 and supplies the cleaning solution to the rear surface Wb from above the processing target wafer W. The cleaning solution from the upper nozzle 113 can suppress the scattering of the dust generated when the peripheral portion We is removed and also suppress the scattering of the dust onto the processing target wafer W. Specifically, the cleaning solution causes the dust to flow toward an outer peripheral side of the processing target wafer W. Further, the lower nozzle 114 is arranged below the chuck 71 and supplies the cleaning solution to the processing target wafer W from the support wafer S side. The cleaning solution from the lower nozzle 114 can more reliably suppress the scattering of the dust. Further, the cleaning solution from the lower nozzle 114 can suppress an inflow of the dust and debris from the peripheral portion We to the support wafer S side.

The number and arrangement of nozzles 113 and 114 are not limited to the present exemplary embodiment. For example, a plurality of nozzles 113 and a plurality of nozzles 114 may be provided. Further, the lower nozzle 114 can be omitted.

Further, the method of suppressing the scattering of the dust is not limited to supplying the cleaning solution. For example, a suction mechanism (not shown) may be provided to suction and remove the generated dust.

Above the chuck 71, an ionizer 115 is provided to suppress electrostatic charging when the peripheral portion We is removed. The configuration, number and arrangement of ionizers 115 are not limited to the present exemplary embodiment.

Further, above the chuck 71, a detection unit 120 is provided to check whether or not the peripheral portion We has been removed from the processing target wafer W. The detection unit 120 detects the presence or absence of the peripheral portion We in the processing target wafer W which is held by the chuck 71 and from which the peripheral portion We is removed. For example, a sensor is used as the detection unit 120. The sensor is, for example, a line-type laser displacement meter and detects the presence or absence of the peripheral portion We by radiating a laser beam to the peripheral portion of the combined wafer T (processing target wafer W) and measuring the thickness of the combined wafer T. The method of detecting the presence or absence of the peripheral portion We by the detection unit 120 is not limited thereto. For example, a line camera may be used as the detection unit 120 to detect the presence or absence of the peripheral portion We by imaging the combined wafer T (processing target wafer W).

Below the chuck 71, a collection unit 130 is provided. The collection unit 130 has a buffer mechanism 131, a crushing mechanism 132 and a collection mechanism 133 in this order from above.

The buffer mechanism 131 temporarily accommodates the peripheral portion We removed by the periphery removing unit 110. The buffer mechanism 131 has a rectangular parallelepiped shape with an open top. A discharge mechanism 134 configured to discharge the peripheral portion We from the buffer mechanism 131 to the crushing mechanism 132 is provided on one side 131a of the buffer mechanism 131. The configuration of the discharge mechanism 134 is determined arbitrarily, but configured to discharge the peripheral portion We from the buffer mechanism 131 to the crushing mechanism 132 at an arbitrary timing. Specifically, for example, a valve or a door (not shown) that can be opened and closed is provided below the discharge mechanism 134. The cleaning solution supplied from the nozzles 113 and 114 is also introduced into the buffer mechanism 131. The cleaning solution is discharged together with the peripheral portion We to the collection mechanism 133 via the discharge mechanism 134 and the crushing mechanism 132.

When the peripheral portion We is discharged from the buffer mechanism 131 to the crushing mechanism 132 via the discharge mechanism 134, an extruding mechanism that pushes out, for example, the peripheral portion We may be provided. Alternatively, the buffer mechanism 131 may be inclined to drop down the peripheral portion We by its own weight.

Further, the buffer mechanism 131 may be equipped with a weight sensor (not shown) configured to measure the weight of the buffer mechanism 131. A measurement result from the weight sensor is output to the control device 100. The control device 100 determines a timing of discharging the peripheral portion We based on the weight measurement result of the buffer mechanism 131 from the weight sensor.

The crushing mechanism 132 is configured to crush the peripheral portion We collected from the buffer mechanism 131 by the collection mechanism 133. The crushing mechanism 132 has, for example, a pair of crushing rollers 135 and 135. The peripheral portion We is crushed while being sandwiched by the pair of crushing rollers 135. The method of crushing the peripheral portion We in the crushing mechanism 132 is not limited thereto. For example, a shredder may be used as the crushing mechanism 132. Alternatively, the crushing mechanism 132 may be provided in the buffer mechanism 131.

The collection mechanism 133 collects the peripheral portion We crushed by the crushing mechanism 132. The collection mechanism 133 has a rectangular parallelepiped shape with an open top, and accommodates and collects the peripheral portion We therein.

A drain board 136 as a liquid removing member is provided inside the collection mechanism 133. A plurality of through holes is formed in the drain board 136, and for example, a punched plate is used. As described above, the cleaning solution as the fluid flows into the collection mechanism 133 together with the peripheral portion We, but the peripheral portion We is collected on the drain board 136 and the cleaning solution is dropped down to below the drain board 136. A drainage pipe 137 is connected to a lower side surface of the collection mechanism 133 so that the cleaning solution dropped down to below the drain board 136 is drained from the drainage pipe 137 to the outside of the collection mechanism 133. Further, in the collection mechanism 133, the configuration for discharging the cleaning solution is not limited thereto.

The collection unit 130 is equipped with a weight sensor 138 as a weight measurement mechanism configured to measure the weight of the collection mechanism 133. A measurement result from the weight sensor 138 is output to the control device 100. The control device 100 determines a timing of replacing the collection mechanism 133 based on the weight measurement result of the collection mechanism 133 from the weight sensor 138.

A plurality of collection mechanisms 133 is provided on transfer rollers 139. Further, the plurality of collection mechanisms 133 is configured to be movable on the transfer rollers 139. Thus, the collection mechanism 133 is configured to be replaceable. The method of collecting the collection mechanism 133 is not limited to the present exemplary embodiment. For example, the collection mechanism 133 may be replaced by using a moving mechanism having a built-in motor.

A configuration of a collection unit is not limited to the collection unit 130, but can be arbitrarily selected as long as it is possible to collect the peripheral portion We.

Hereinafter, a processing of removing the peripheral portion We performed by the periphery removing device 70 configured as described above will be described.

First, the wafer transfer device 80 carries the combined wafer T into the periphery removing device 70. In the combined wafer T, the processing target wafer W is provided with the periphery modification layer M1 and the divided modification layer M2. Then, the combined wafer T is transferred to and held by the chuck 71.

Figure 12A:
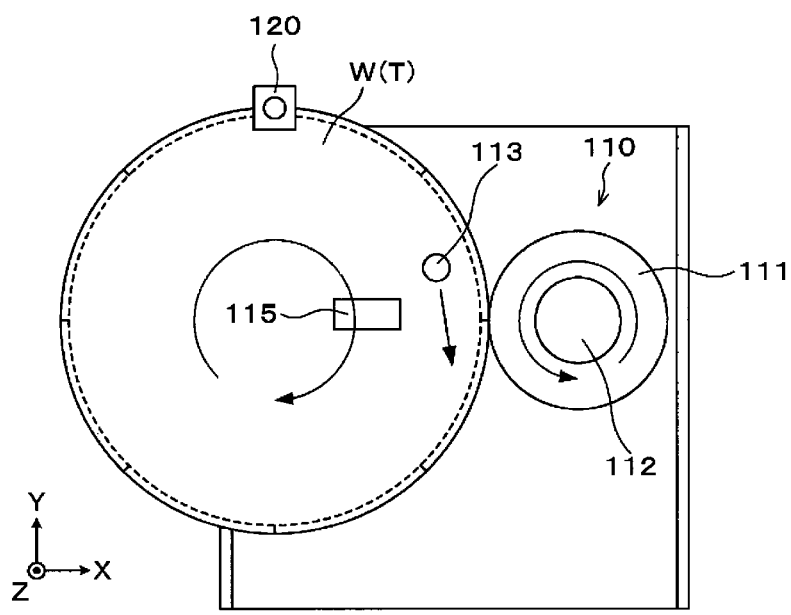
FIG. 12A and FIG. 12B are explanatory diagrams illustrating an operation in which a peripheral portion is removed by a periphery removing device.
Figure 12B:
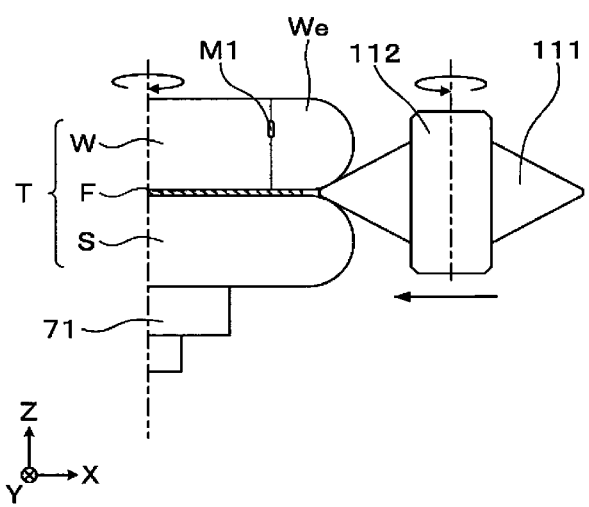

Then, as shown in FIG. 12A and FIG. 12B, the wedge roller 111 is moved to the combined wafer T side, and the wedge roller 111 is brought into contact with the interface between the processing target wafer W and the support wafer S. Here, by rotating the chuck 71, the wedge roller 111 also rotates in the opposite direction when viewed from the top. In the illustrated example, the chuck 71 rotates clockwise and the wedge roller 111 rotates counterclockwise when viewed from the top.

Figure 13A:
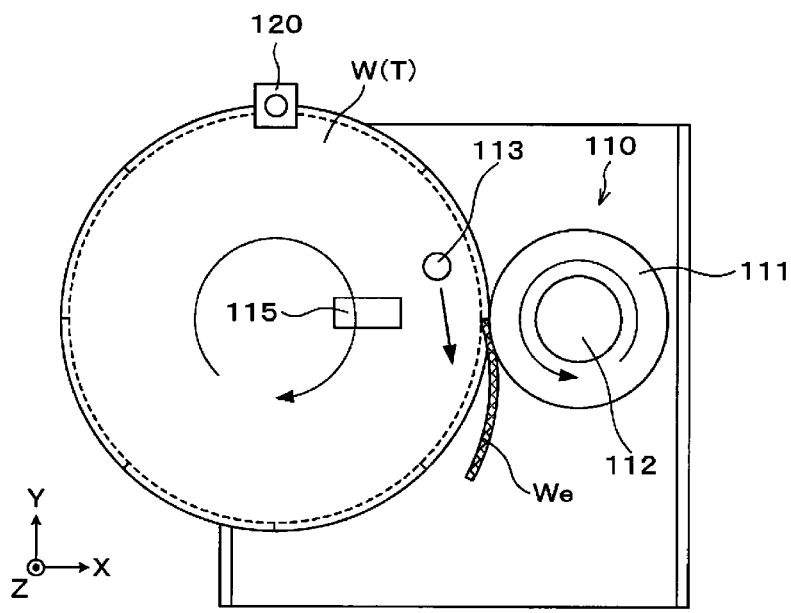
FIG. 13A and FIG. 13B are explanatory diagrams illustrating the operation in which the peripheral portion is removed by the periphery removing device.
Figure 13B:
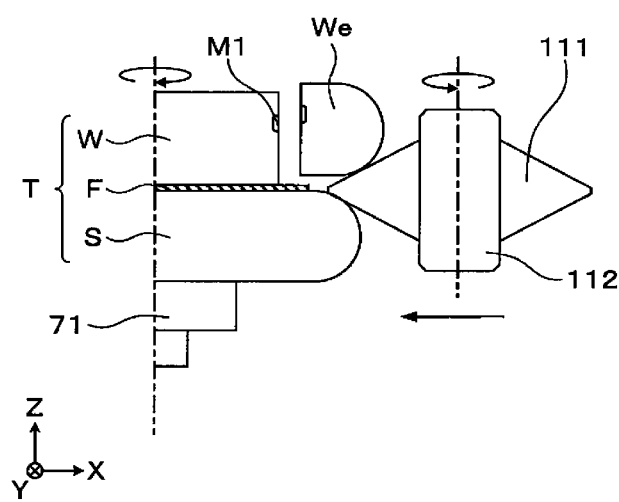

Thereafter, as shown in FIG. 13A and FIG. 13B, while rotating the chuck 71, the wedge roller 111 is further moved and inserted into the interface between the processing target wafer W and the support wafer S. Here, the wedge roller 111 may be inserted at a constant pressure by, for example, a spring. Then, the peripheral portion We is pushed up to be separated from the processing target wafer W starting from the periphery modification layer M1. Here, the peripheral portion We is fragmented starting from the divided modification layer M2. Then, the peripheral portion We is removed at a downstream side in a rotation direction (at a negative Y-axis side) of the chuck 71 with respect to the periphery removing unit 110.

Here, when the peripheral portion We is separated, it is desirable that the wedge roller 111 is inserted into the interface between the processing target wafer W and the support wafer S while avoiding the position where the divided modification layer M2 is formed. When the wedge roller 111 is inserted at the position where the divided modification layer M2 is formed, the wedge roller 111 may collide with an end portion of the fragmented peripheral portion We so that the wedge roller 111 may be consumed by an impact of the collision. Therefore, by inserting the wedge roller 111 while avoiding the formation position of the divided modification layer M2 as described above, it is possible to suppress the consumption of the wedge roller 111.

When the peripheral portion We is removed, static electricity may be generated. However, in the present exemplary embodiment, the ionizer 115 is operated when the peripheral portion We is removed. Thus, the electrostatic charging can be suppressed. Therefore, it is possible to suppress the occurrence of electrostatic damage to the processing target wafer W caused by the static electricity, and the adhesion of the dust to the processing target wafer W when the peripheral portion We is removed.

The removed peripheral portion We is dropped down to be accommodated in the buffer mechanism 131. Further, the peripheral portion We is discharged from the discharge mechanism 134 to the crushing mechanism 132, crushed by the crushing mechanism 132 and then collected by the collection mechanism 133.

Then, when the chuck 71 is rotated 360 degrees, the peripheral portion We is removed from the entire circumference by the periphery removing unit 110 and then collected by the collection mechanism 133.

Further, in the present exemplary embodiment, when the chuck 71 is rotated, a portion of the processing target wafer W from which the peripheral portion We has been removed by the periphery removing unit 110 is located below the detection unit 120. Here, by detecting the presence or absence of the peripheral portion We by the detection unit 120, it is possible to check whether or not the peripheral portion We has been appropriately removed. Then, it is possible to suppress a transfer of the processing target wafer W (combined wafer T) to a next processing unit, i.e., the processing device 90, in a state where the peripheral portion We remains on the processing target wafer W. For example, when it is confirmed that the peripheral portion We has not been removed, the processing of removing the peripheral portion We is performed again, or a transfer of the combined wafer T to the next processing device 90 is prohibited. Specifically, for example, an operator may remove the peripheral portion We, or the combined wafer T may be returned to the cassette Ct.

Further, in the present exemplary embodiment, the weight sensor 138 in the collection mechanism 133 measures the weight. Then, when the weight measured by the weight sensor 138 exceeds a predetermined threshold, i.e., the capacity of the collection mechanism 133 for collecting the peripheral portion We, the collection mechanism 133 is replaced. The replaced collection mechanism 133 is carried out by, for example, the operator.

When the collection mechanism 133 is replaced, the peripheral portion We removed by the periphery removing unit 110 is accommodated in the buffer mechanism 131 and is not discharged to the crushing mechanism 132. Then, even when the collection mechanism 133 is replaced, it is not necessary to stop the processing of removing the peripheral portion We by the periphery removing unit 110, and, thus, the throughput of the wafer processing can be improved.

As described above, in the periphery removing device 70 according to the present exemplary embodiment, the peripheral portion We can be removed from the processing target wafer W and can be appropriately collected. Further, since the peripheral portion We can be removed with the periphery modification layer M1 formed by the laser beam or the like without using a grinding tool (grinding whetstone) as in the conventional technique, it is possible to reduce running costs compared to when the edge trim is conventionally performed by grinding. Further, since the peripheral portion We can be appropriately collected, it is possible to reuse the peripheral portion We and further reduce the running costs.

Particularly, in the present exemplary embodiment, since the peripheral portion We is pushed up by the wedge roller 111, the peripheral portion We can be easily separated from the interface between the processing target wafer W and the support wafer S. Thus, it is possible to increase the distance L between the periphery modification layer M1 and the outer end portion of the bonding region Aa shown in FIG. 7.

Further, by pushing up and removing the peripheral portion We, it is possible to suppress contact and damage of the removed peripheral portion We to the support wafer S.

Figure 14:
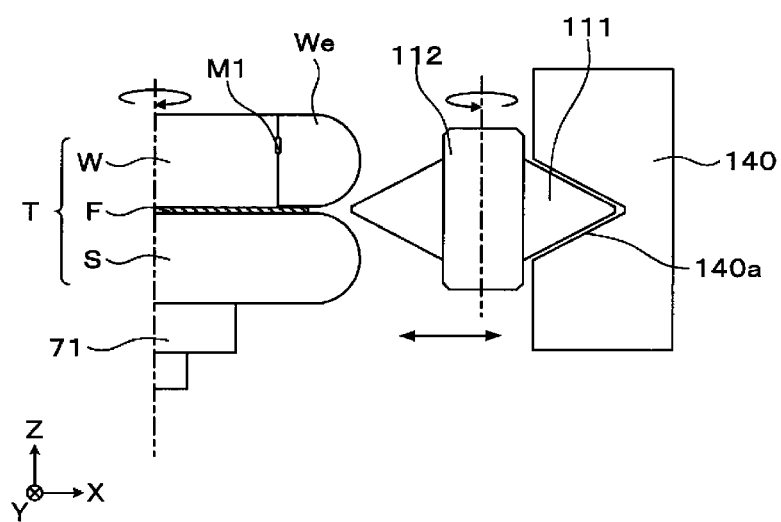
FIG. 14 is an explanatory diagram illustrating a state in which a wiper is provided on a pad.

The wedge roller 111 of the present exemplary embodiment may also be equipped with a wiper 140 configured to clean the wedge roller 111 as shown in FIG. 14. One side surface 140a of the wiper 140 has a shape conforming to the outer shape of the wedge roller 111. Also, the wiper 140 contacts the wedge roller 111 on the opposite side of the wedge roller 111 from the chuck 71 to clean the wedge roller 11.

Figure 15:
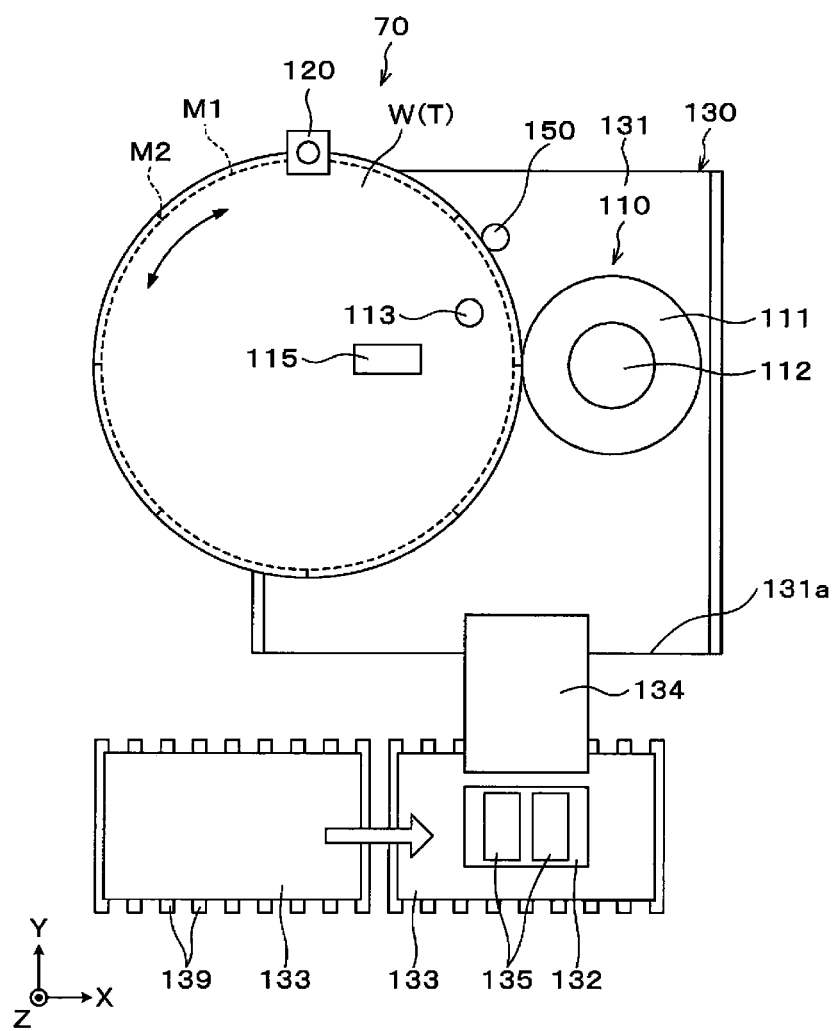
FIG. 15 is a plan view illustrating an example configuration of a periphery removing device.

In the present exemplary embodiment, as shown in FIG. 15, a contact member 150 in contact with the outer end portion of the combined wafer T may be provided at an upstream side in the rotation direction (at a positive Y-axis side) of the chuck 71 with respect to the periphery removing unit 110. When the peripheral portion We is pushed up by the wedge roller 111, the influence is transferred to the upstream side, and, thus, the peripheral portion We may be removed on the upstream side. In this case, the peripheral portion We may not be collected by the buffer mechanism 131. In this regard, the contact member 150 can suppress the removal of the peripheral portion We on the upstream side of the periphery removing unit 110. Instead of providing the contact member 150, the buffer mechanism 131 may be increased in size when viewed from the top.

In the present exemplary embodiment, the peripheral portion We is separated and removed from the processing target wafer W by using the periphery removing unit 110, but the method of removing the peripheral portion We is not limited thereto.

Figure 16:
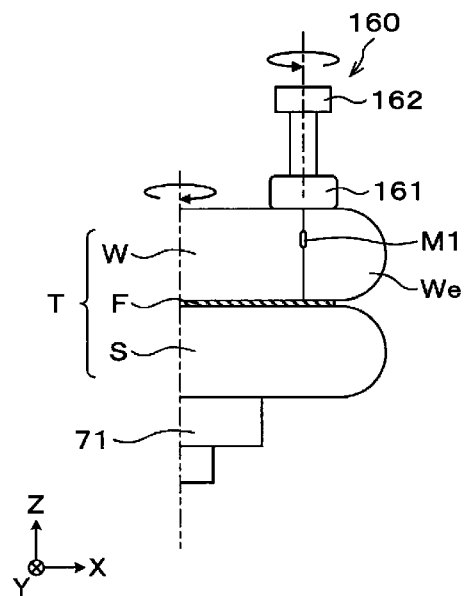
FIG. 16 is a side view illustrating an example configuration of a periphery removing device.
Figure 17:
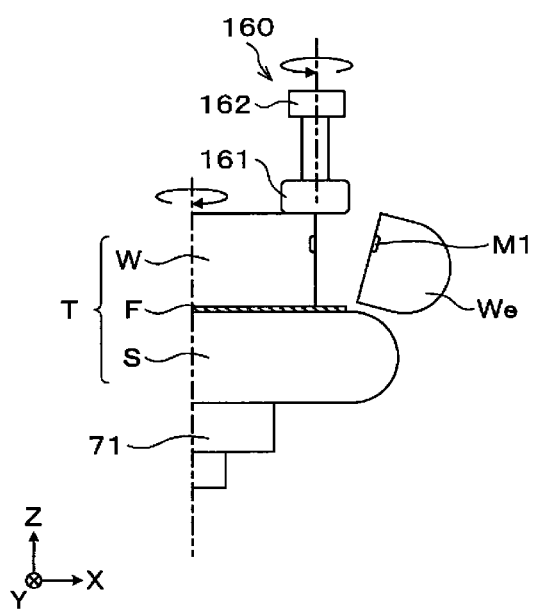
FIG. 17 is an explanatory diagram illustrating an operation in which the peripheral portion is removed by the periphery removing device.

For example, as shown in FIG. 16, the periphery removing device 70 may be equipped with a periphery removing unit 160 instead of the periphery removing unit 110. The periphery removing unit 160 has a friction roller 161. The friction roller 161 is configured to be rotatable around a vertical axis by a rotating mechanism 162. Then, as shown in FIG. 17, the friction roller 161 is brought into contact with the processing target wafer W and rotated on the periphery modification layer M1 so that an external force acts diametrically outwards on the processing target wafer W. Due to this external force, the peripheral portion We is separated and removed from the processing target wafer W. Then, the removed peripheral portion We is collected by the collection mechanism 133 via the buffer mechanism 131 and the crushing mechanism 132.

Figure 18:
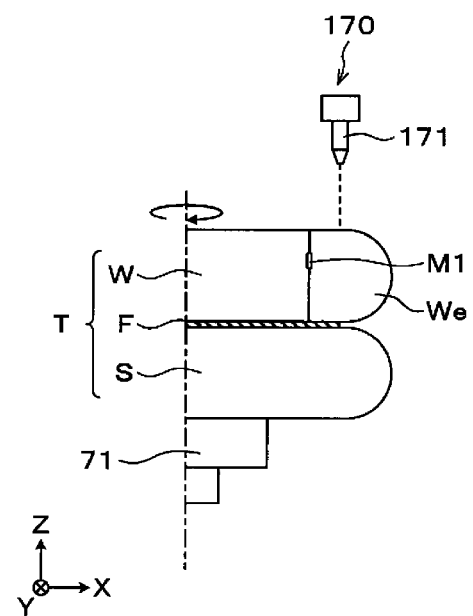
FIG. 18 is a side view illustrating an example configuration of a periphery removing device.

Further, for example, as shown in FIG. 18, the periphery removing device 70 may be equipped with a periphery removing unit 170 instead of the periphery removing unit 110. The periphery removing unit 170 has a nozzle 171 configured to supply a fluid to the peripheral portion We. For example, water, high-pressure water, double fluids, air or the like is used as the fluid. Then, the peripheral portion We is separated and removed from the processing target wafer W by the fluid supplied from the nozzle 171. The removed peripheral portion We is collected by the collection mechanism 133 via the buffer mechanism 131 and the crushing mechanism 132.

Figure 19:
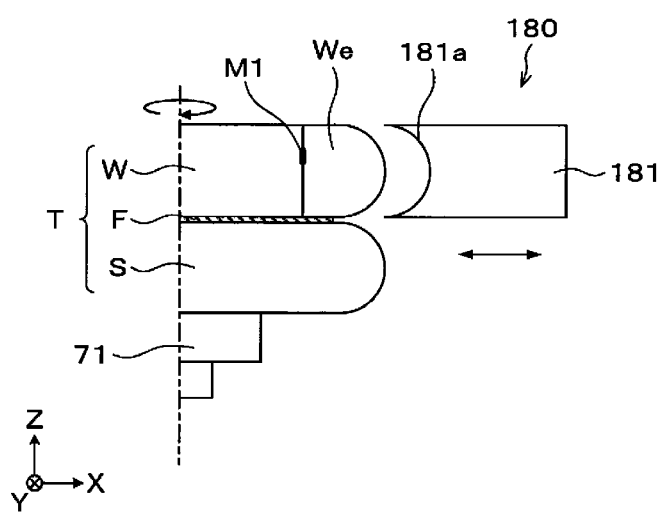
FIG. 19 is a side view illustrating an example configuration of a periphery removing device.

Furthermore, for example, as shown in FIG. 19, the periphery removing device 70 may be equipped with a periphery removing unit 180 instead of the periphery removing unit 110. The periphery removing unit 180 has a contact member 181 configured to contact an outer end portion of the peripheral portion We. A tip end portion 181a of the contact member 181 has a shape conforming to an outer side surface of the peripheral portion We. Then, the contact member 181 is brought into contact with the peripheral portion We so that the peripheral portion We is separated and removed from the processing target wafer W. The removed peripheral portion We is collected by the collection mechanism 133 via the buffer mechanism 131 and the crushing mechanism 132.

Figure 20:
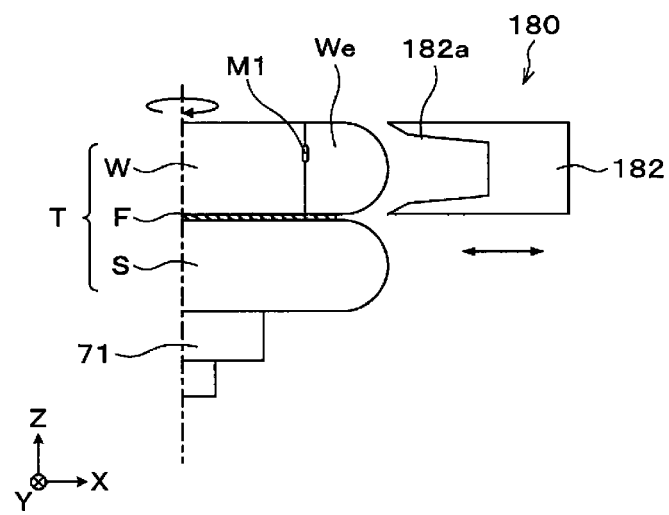
FIG. 20 is a side view illustrating an example configuration of a periphery removing device.

In the periphery removing unit 180, a member configured to contact the outer end portion of the peripheral portion We is not limited to the contact member 181. For example, as shown in FIG. 20, the periphery removing unit 180 may be equipped with a clamp member 182 configured to contact and grip the peripheral portion We. A tip end portion 182a of the clamp member 182 is formed into a claw shape capable of gripping the peripheral portion We. The tip end portion 182a does not need to have claws on both the upper and lower sides, and may have claws on any one side. Further, the periphery removing unit 180 may be equipped with, for example, a brush (not shown) as the contact member.

Figure 21:
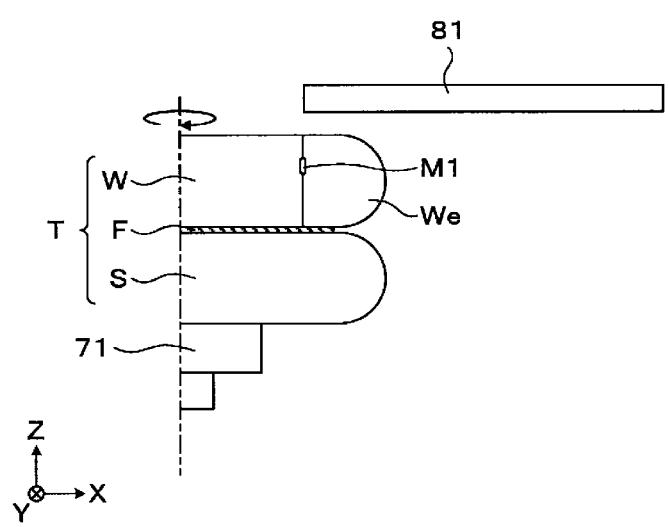
FIG. 21 is a side view illustrating an example configuration of a periphery removing device.

Furthermore, for example, the periphery removing unit may be a transfer arm 81 of the wafer transfer device 80, which is a transfer unit, as shown in FIG. 21. In this case, the transfer arm 81 is brought into contact with the peripheral portion We so that the peripheral portion We is separated and removed from the processing target wafer W. The removed peripheral portion We is collected by the collection mechanism 133 via the buffer mechanism 131 and the crushing mechanism 132.

Figure 22:
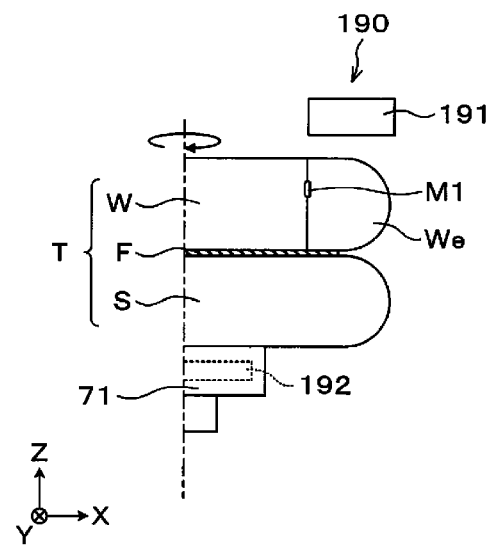
FIG. 22 is a side view illustrating an example configuration of a periphery removing device.

Further, for example, as shown in FIG. 22, the periphery removing device 70 may be equipped with a periphery removing unit 190 instead of the periphery removing unit 110. The periphery removing unit 190 has a heater 191 configured to heat the peripheral portion We. The heater 191 generates heat by, for example, a power fed thereto. Then, as the peripheral portion We is heated by the heater 191, the peripheral portion We is expanded, and the peripheral portion We is separated and removed from the processing target wafer W. The removed peripheral portion We is collected by the collection mechanism 133 via the buffer mechanism 131 and the crushing mechanism 132.

The periphery removing unit 190 of the present exemplary embodiment may cool the support wafer S. For example, a cooling member 192 is provided inside the chuck 71. For example, a coolant passage through which a cooling medium flows, a Peltier element or the like is used as the cooling member 192. In this case, a temperature difference between the peripheral portion We and the support wafer S increases, and, thus, the peripheral portion We can be separated more easily.

Figure 23:
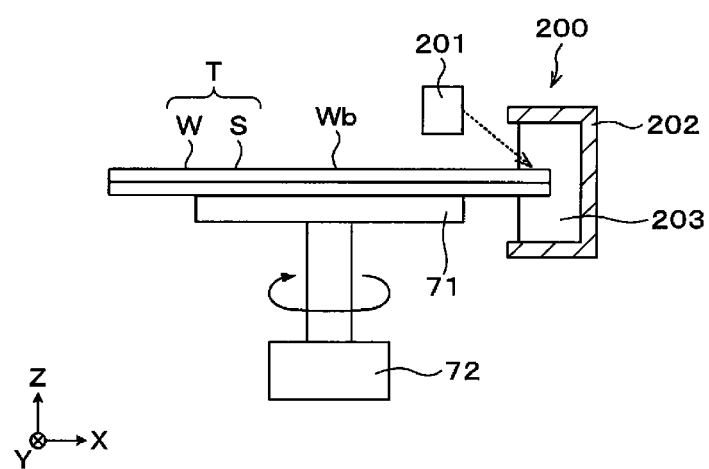
FIG. 23 is a side view illustrating an example configuration of a periphery removing device.

For example, as shown in FIG. 23, a periphery removing unit 200 may be equipped with an ultrasonic wave oscillator 201 configured to apply ultrasonic waves to the peripheral portion We. The peripheral portion We is immersed in pure water 203 stored in a pure water tank 202 and applied with the ultrasonic waves from the ultrasonic wave oscillator 201. The peripheral portion We is separated and removed from the processing target wafer W by the ultrasonic waves. In the present exemplary embodiment, the pure water tank 202 has the same function as the buffer mechanism 131 described above. Also, the removed peripheral portion We is discharged from the pure water tank 202 to the crushing mechanism 132 and collected by the collection mechanism 133. Further, in the present exemplary embodiment, the insertion member may be inserted into the interface between the processing target wafer W and the support wafer S while the ultrasonic waves are applied to the peripheral portion We.

As described above, it is possible to remove the peripheral portion We from the processing target wafer W and appropriately collect the peripheral portion We by using any one of the periphery removing units 160, 170, 180, 190 and 200.

Figure 24:
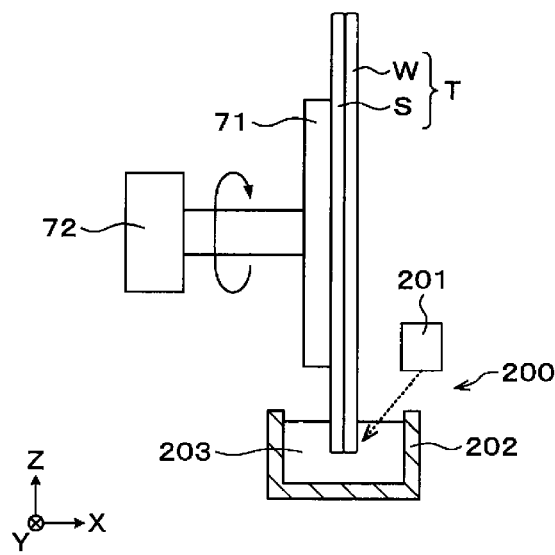
FIG. 24 is a side view illustrating an example configuration of a periphery removing device.

In the present exemplary embodiment, the combined wafer T is held on the chuck 71 in the horizontal direction, i.e., an in-plane direction of the combined wafer T is set to the horizontal direction. Otherwise, the combined wafer T may be held in the vertical direction as shown in FIG. 24. That is, the in-plane direction of the combined wafer T may be set to the vertical direction. In this case, the periphery removing unit 200 is provided under the combined wafer T. Further, the peripheral portion We removed by the periphery removing unit 200 is dropped down by its own weight and collected by the collection mechanism 133. In the present exemplary embodiment, the periphery removing device 70 may be equipped with a mechanism (not shown) configured to change the in-plane direction of the combined wafer T to be carried-in/out. By this mechanism, the in-plane direction of the combined wafer T to be carried in is changed from the horizontal direction to the vertical direction and the in-plane direction of the combined wafer T to be carried out is changed from the vertical direction to the horizontal direction. Further, although the periphery removing unit 200 is illustrated as the periphery removing unit in the present exemplary embodiment, the method of removing the peripheral portion We while holding the combined wafer T in the vertical direction can also be applied to the other periphery removing units 110, 160, 170, 180 and 190.

In the above-described exemplary embodiment, the collection mechanism 133 is provided inside the periphery removing device 70, but may be provided outside the periphery removing device 70.

Hereinafter, a configuration of a periphery removing device 270 according to a second exemplary embodiment will be described. In the periphery removing device 270, parts having substantially same functions and configurations will be assigned same reference numerals, and redundant description thereof will be omitted. Further, in FIG. 27, the combined wafer T is illustrated as a single substrate, for avoiding the complexity of illustration in FIG. 27.

Figure 25:
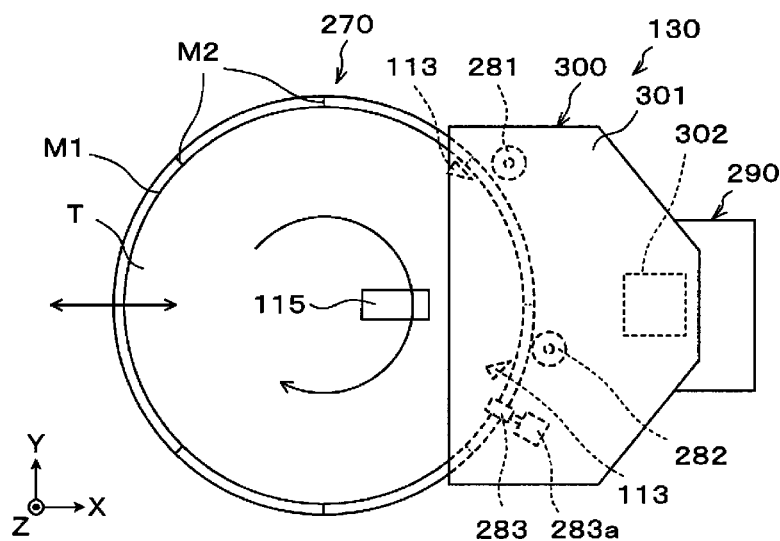
FIG. 25 is a plan view illustrating an example configuration of a periphery removing device according to a second exemplary embodiment.
Figure 26:
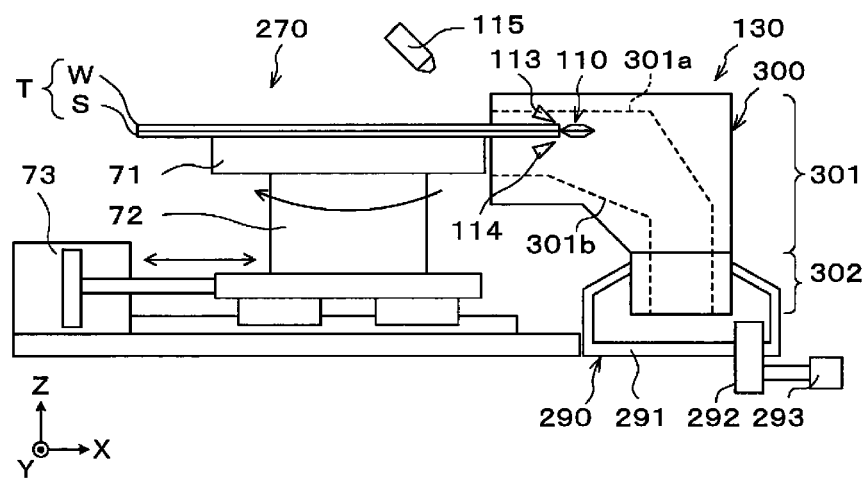
FIG. 26 is a front view illustrating an example configuration of the periphery removing device according to the second exemplary embodiment.

As shown in FIG. 25 and FIG. 26, the periphery removing device 270 has the chuck 71 that serves as the substrate holder configured to hold the combined wafer T on the upper surface thereof. The chuck 71 holds the support wafer S in a state where the processing target wafer W is on the upper side and the support wafer S is on the lower side. The chuck 71 is configured to be rotatable around a vertical axis by the rotating mechanism 72.

The chuck 71 is configured to be movable in the horizontal direction by a moving mechanism 73 such as an air cylinder. By the moving mechanism 73, the combined wafer T held by the chuck 71 can be moved between a delivery position and a processing position. More specifically, the delivery position of the combined wafer T refers to a position where the combined wafer T is delivered between the chuck 71 and the wafer transfer device 80 and where the outer end portion of the combined wafer T retreats from a cover body 301 to be described later (at a negative X-axis side in FIG. 26). Further, the processing position of the combined wafer T refers to a position where the peripheral portion We is removed and the outer end portion of the combined wafer T enters the cover body 301 to be described later (at a positive X-axis side in FIG. 26).

The periphery removing unit 110 configured to remove the peripheral portion We of the processing target wafer W is provided at the processing position of the combined wafer T on the side of the chuck 71. The periphery removing unit 110 applies an impact to the peripheral portion We to peel and remove, starting from the periphery modification layer M1, the peripheral portion We from the central portion Wc. Further, the peripheral portion We removed by the periphery removing unit 110 is collected by the collection unit 130 provided below the periphery removing unit 110. The collection unit 130 is equipped with a collection mechanism 290 configured to collect the peripheral portion We removed by the periphery removing unit 110 and particles generated when the peripheral portion We is removed; and a discharge mechanism 300 configured to form a collection path for the peripheral portion We and the particles.

Figure 27:
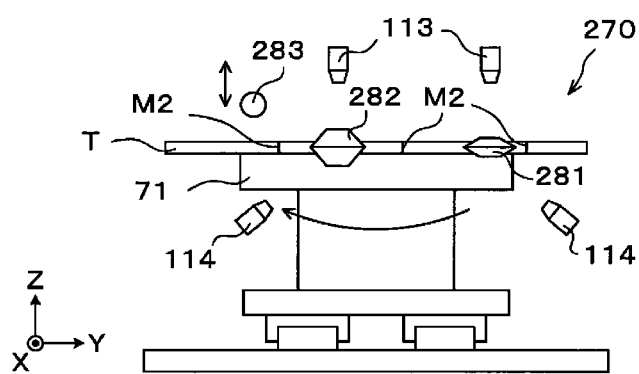
FIG. 27 is a side view illustrating an example configuration of the periphery removing device according to the second exemplary embodiment.

The periphery removing unit 110 is equipped with a wedge roller 281, which serves as a first insertion member; a wedge roller 282, which serves as a second insertion member; a pressing roller 283, which serves as a pressing member; an upper nozzle 113 and a lower nozzle 114, which serve as a fluid supply; and an ionizer 115. As shown in FIG. 27, the wedge roller 281, the wedge roller 282 and the pressing roller 283 are arranged parallel to each other in this order from the upstream side in the rotation direction of the combined wafer T.

As shown in FIG. 27, the wedge roller 281 has a wedge shape with a sharp pointed tip when viewed from the side and is configured to be rotatable around a vertical axis. The wedge roller 281 is inserted into the interface between the processing target wafer W and the support wafer S (hereinafter, simply referred to as "interface") of the combined wafer T moved to the processing position. Then, the peripheral portion We is pushed up by the inserted wedge roller 281 in a direction to be peeled from the support wafer S, and, thus, the peripheral portion We is removed starting from the periphery modification layer M1. At the same time, the peripheral portion We is fragmented starting from the divided modification layer M2 formed on the peripheral portion We.

Figure 28:
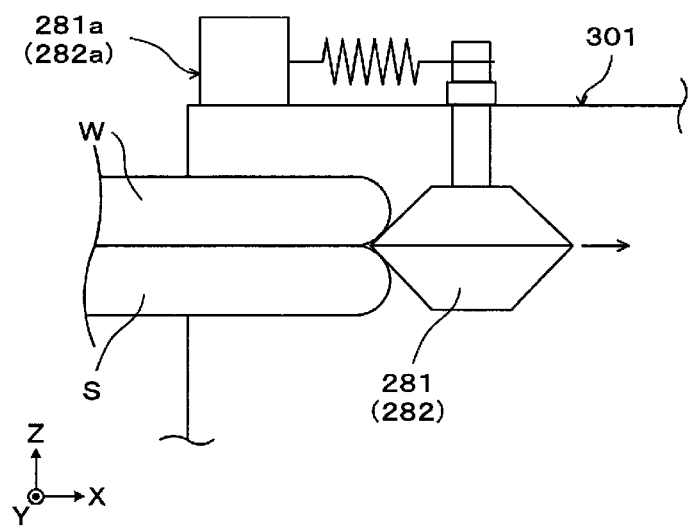
FIG. 28 is an enlarged view of principal parts illustrating a schematic configuration of a moving mechanism of a wedge roller according to the second exemplary embodiment.

Further, as shown in FIG. 28, the wedge roller 281 is configured to be movable back and forth with respect to a movement direction of the combined wafer T by a buffer mechanism 281a composed of, for example, a spring member when inserted into the interface of the combined wafer T placed at the processing position. More specifically, the wedge roller 281 retreats with respect to the movement direction of the combined wafer T by the moving mechanism 73 when inserted into the interface of the combined wafer T moved to the processing position so that an impact during the insertion can be absorbed. The buffer mechanism 281a is provided, for example, on a ceiling surface of the cover body 301 to be described later.

As shown in FIG. 27, the wedge roller 282 has a wedge shape with a sharp pointed tip when viewed from the side and is configured to be rotatable around a vertical axis. As shown in FIG. 27, the wedge roller 282 is larger than the wedge roller 281, and specifically, has a larger edge angle. The wedge roller 282 is inserted between the peripheral portion We pushed up by the wedge roller 281 and the support wafer S from the diametrically outside of the combined wafer T when the peripheral portion We cannot be appropriately fragmented starting from the divided modification layer M2 by the wedge roller 281. Since the wedge roller 282 has a larger edge angle than the wedge roller 281, the peripheral portion We is further pushed up in the direction to be peeled from the support wafer S, and, thus, the peripheral portion We can be removed more appropriately.

Further, as shown in FIG. 28, the wedge roller 282 is configured to be movable to and from the combined wafer T placed at the processing position by a buffer mechanism 282a, i.e., to be movable between a standby position and the processing position. The buffer mechanism 282a has the same configuration as the buffer mechanism 281a described above.

Figure 29:
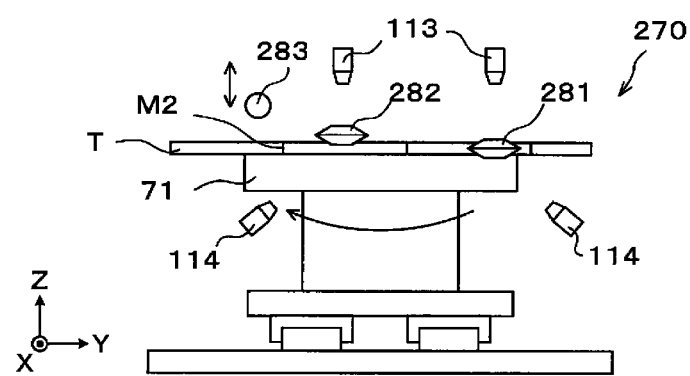
FIG. 29 is a side view illustrating an example configuration of the periphery removing device according to the second exemplary embodiment.

The wedge roller 282 just needs to push up the peripheral portion We more than at least the wedge roller 281 in the direction to be peeled from the support wafer S. For example, as shown in FIG. 29, the wedge roller 282 may be configured to have an edge angle equivalent to that of the wedge roller 281 and provided at a higher position in a height direction (Z-axis direction) than the wedge roller 281.

The wedge roller 281 and the wedge roller 282 may be provided in the rotation direction of the combined wafer T at a greater interval than the interval between the divided modification layers M2 as shown in FIG. 27. As a result, for example, when the peripheral portion We is appropriately fragmented by the wedge roller 281, the removed peripheral portion We is appropriately dropped down between the wedge roller 281 and the wedge roller 282, and then, discharged to the collection mechanism 290. The peripheral portion We can be processed by the wedge roller 282 only when the peripheral portion We cannot be appropriately fragmented by the wedge roller 281.

Although the wedge roller 281 and the wedge roller 282 are used as the insertion member in the above description, the configuration of the insertion member is not limited thereto. For example, the insertion member just needs to have a shape in which the width decreases diametrically outwards when viewed from the side, and a knife-shaped insertion member having a sharp pointed tip may be used.

Returning back to the description of the periphery removing unit 110, the pressing roller 283 is provided at a downstream side of the wedge roller 282 in the rotation direction of the combined wafer T. The pressing roller 283 is configured to be movable up and down by an elevating mechanism 283a, and presses the peripheral portion We pushed up by the wedge roller 282 toward the support wafer S from above. Since the peripheral portion We is pressed by the pressing roller 283 in this way, the peripheral portion We is fractured at the divided modification layer M2 by using the wedge roller 282 as a supporting point to be reliably fragmented into small pieces.

The pressing roller 283 just needs to apply a downward force (direction toward the support wafer S) to the peripheral portion We pushed up by the wedge roller 282, specifically, just needs to fracture the peripheral portion We by using the wedge roller 282 as the supporting point. That is, if the pressing roller 283 can appropriately draw downwards the peripheral portion We pushed up by the wedge roller 282, the elevating mechanism 283a is not necessary. In this case, the pressing roller 283 can appropriately draw the peripheral portion We downwards to be placed as low as possible, and, thus, the downward force applied to the peripheral portion We can be increased.

Further, the wedge roller 282 and the pressing roller 283 may be provided in the rotation direction of the combined wafer T at a smaller interval than the interval between the divided modification layers M2 as shown in FIG. 27. Thus, it is possible to appropriately apply a force for fragmenting the peripheral portion We to the peripheral portion We pushed up by the wedge roller 282.

The upper nozzles 113 are provided above the combined wafer T placed at the processing position and configured to supply a fluid toward contact points (hereinafter, referred to as "processing points") between the wedge rollers 281 and 282 and the peripheral portion We in the rotation direction of the combined wafer T. As the fluid to be supplied, for example, air, a cleaning solution (pure water, etc.) or the like is used.

Here, before the peripheral portion We is removed along the periphery modification layer M1 by applying the impact to the peripheral portion We, the peripheral portion We and the central portion We are still connected to each other. Thus, particles are generated by fracturing the connected portion.

Therefore, the upper nozzles 113 supply the fluid toward the processing points of the wedge rollers 281 and 282 and thus suppress the scattering of the particles, generated by the fracturing, into the periphery removing device 270.

Further, it is desirable that the supply of the fluid from the upper nozzles 113 is performed toward the processing points and toward a discharge duct 302 to be described later in order to appropriately discharge the particles to the collection mechanism 290. That is, in the periphery removing device 270, it is desirable that the positions of the upper nozzles 113 is determined such that the upper nozzles 113, the processing points of the wedge rollers and the discharge duct 302 to be described later are aligned on the same straight line.

The lower nozzles 114 are provided below the combined wafer T placed at the processing position and configured to supply a fluid toward the processing points of the wedge rollers 281 and 282 in the rotation direction of the combined wafer T. As the fluid to be supplied, for example, air, a cleaning solution (pure water, etc.) or the like is used.

With the lower nozzles 114 similarly to the upper nozzles 113, it is possible to discharge the particles generated at the processing points of the wedge rollers to the collection mechanism 290 and also possible to suppress an inflow of the particles to the rear surface of the combined wafer T (the rear surface Sb of the support wafer S).

The number and the arrangement of upper nozzles 113 and lower nozzles 114 are not limited to the above-described example. In the above-described example, two upper nozzles 113 and two lower nozzles 114 are provided according to the number of wedge rollers, but one upper nozzle 113 and one lower nozzle 114 may be provided, or three or more upper nozzles 113 and three or more lower nozzles 114 may be provided. Further, the number of upper nozzles 113 may not be the same as the number of lower nozzles 114. Furthermore, the lower nozzles 114 may not be provided.

The ionizer 115 is provided above the chuck 71. The ionizer 115 is configured to suppress the electrostatic charging when the peripheral portion We is removed. The configuration, number and arrangement of ionizers 115 are not limited to the present exemplary embodiment.

As shown in FIG. 26, the collection mechanism 290 has a collection container 291 configured to collect the removed peripheral portion We and a filter 292 configured to collect the particles generated by the fracturing. Further, the collection mechanism 290 is connected to a suction mechanism 293, such as a vacuum pump, capable of suctioning the atmosphere inside the discharge mechanism 300 via the filter 292.

As shown in FIG. 25 and FIG. 26, the discharge mechanism 300 has the cover body 301 and the discharge duct 302 that form a collection path for the removed peripheral portion We and the particles.

Inside the cover body 301, a collection path 301a through which the removed peripheral portion We and the particles are discharged is formed. One end of the collection path 301a covers the outer end portion of the combined wafer T held by the chuck 71 and placed at the processing position, and the other end of the collection path 301a is connected to the discharge duct 302. Further, the cover body 301 needs to be arranged such that the collection path 301a covers the processing points of the wedge rollers 281 and 282 and the pressing roller 283. In other words, the periphery removing unit 110 is provided inside the cover body 301.

Further, the collection path 301a has an inclined portion 301b for discharging the peripheral portion We removed by the periphery removing unit 110 to the collection mechanism 290. The inclined portion 301b is formed from the inside in the diametrical direction of the combined wafer T at least immediately below the processing points of the wedge rollers inside the cover body 301. The removed peripheral portion We is dropped down by its own weight from the processing points to the inclined portion 301b, slid down along the inclined portion 301b, and collected by the collection mechanism 290 via the discharge duct 302.

The surface of the inclined portion 301b may be subjected to a friction reduction treatment by, for example, resin coating. Thus, the peripheral portion We can be more appropriately discharged to the collection mechanism 290.

The discharge duct 302 has one end connected to the collection path 301a of the cover body 301 and the other end located inside the collection container 291 of the collection mechanism 290. The discharge duct 302 discharges the peripheral portion We, which has slid down the inclined portion 301b, to the collection mechanism 290. Further, the particles received by the cover body 301 are discharged to the collection mechanism 290. That is, the discharge duct 302 discharges the peripheral portion We and the particles from the cover body 301 to the collection mechanism 290.

As described above, the inside of the discharge mechanism 300 is suctioned by the suction mechanism 293 provided in the collection mechanism 290. As a result, in the discharge mechanism 300, an air flow is formed from the cover body 301 toward the discharge duct 302. That is, the particles generated by the fracturing can be guided to the collection mechanism 290.

The discharge mechanism 300 may be configured to be movable in the diametrical direction of the combined wafer T by a non-illustrated moving mechanism. More specifically, the discharge mechanism 300 may be configured such that the distance between the periphery removing unit 110 and the combined wafer T can be relatively adjusted by moving the cover body 301 in the diametrical direction of the combined wafer T.

The periphery removing device 270 according to the present exemplary embodiment is configured as described above. Hereinafter, an edge trim method performed by the periphery removing device 270 will be described with reference to the accompanying drawings.

Figure 30A:
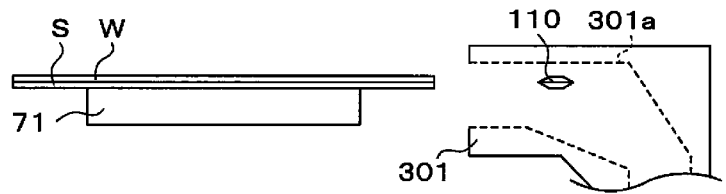
FIG. 30A to FIG. 30E are front views explaining major processes of an edge trim according to the second exemplary embodiment.

First, as shown in FIG. 30A, the combined wafer T, which is the processing target, is carried into the periphery removing device 270 by the wafer transfer device 80 and held by the chuck 71 placed at the delivery position.

Figure 30B:
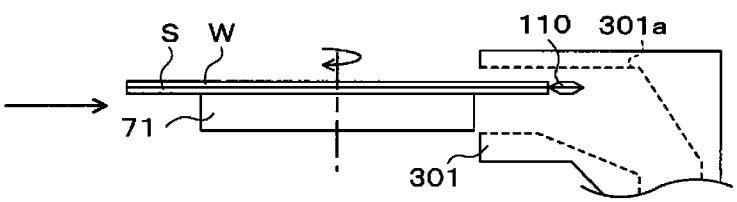
Figure 30C:
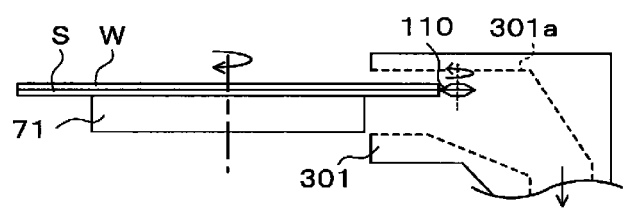

When the combined wafer T is held by the chuck 71, the combined wafer T is subsequently moved to the processing position as shown in FIG. 30B and the outer end portion thereof enters into the cover body 301. Also, the wedge roller 281 of the periphery removing unit 110 is inserted into the interface of the combined wafer T. Here, since the wedge roller 281 is equipped with the buffer mechanism 281a, the wedge roller 281 appropriately absorbs the impact when inserted into the interface of the combined wafer T, and is appropriately pushed into the interface. Then, when the combined wafer T is placed at the processing position, the combined wafer T is rotated by the rotating mechanism 72 as shown in FIG. 30C.

When the combined wafer T is placed at the processing position, the rotation of the wedge roller 281 is subsequently started by a non-illustrated rotating mechanism. At the same time, the supply of the fluid from the upper nozzles 113 and the lower nozzles 114, the suction of the inside of the discharge mechanism 300 by the suction mechanism 293, and the operation of the ionizer 115 are started.

Figure 31A:
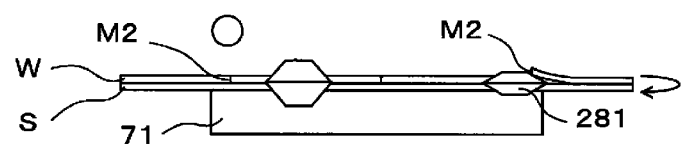
FIG. 31A to FIG. 31D are side views explaining major processes of the edge trim according to the second exemplary embodiment.
Figure 31B:
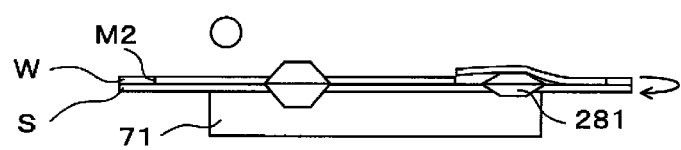

When the wedge roller 281 is inserted into the interface, the peripheral portion We is peeled from the support wafer S as shown in FIG. 31A and the peripheral portion We is fractured along one divided modification layer M2. Since the combined wafer T is rotated by the rotating mechanism 72, the peripheral portion We is peeled off in the rotation direction of the combined wafer T as shown in FIG. 31B. Further, since a non-bonding region Ab is formed on the peripheral portion We of the processing target wafer W as described above, the peripheral portion We is appropriately peeled off.

Figure 31C:
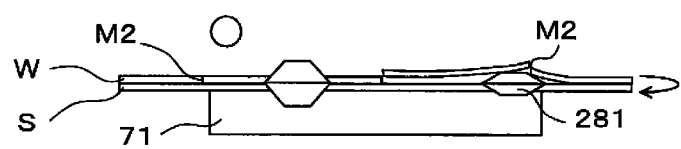

As the combined wafer T is rotated, the peripheral portion We is peeled off, and when the wedge roller 281 reaches near a next divided modification layer M2, the peripheral portion We is fractured starting from the next divided modification layer M2. Then, as shown in FIG. 31C, the peripheral portion We is fragmented into small pieces.

Figure 30D:
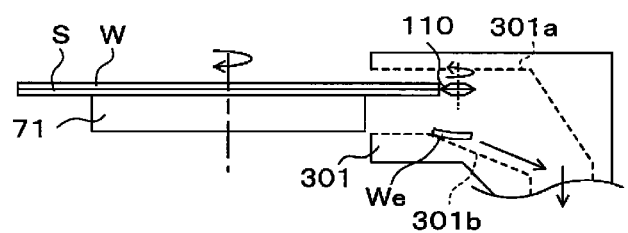
Figure 31D:
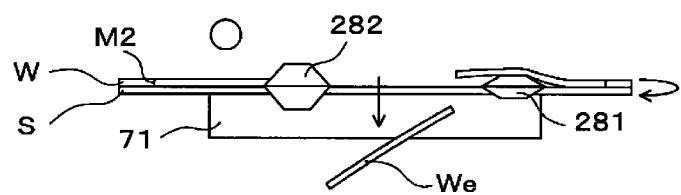

The fragmented peripheral portion We is dropped down into the cover body 301, specifically, into the discharge duct 302 as shown in FIG. 30D and FIG. 31D. Further, the wedge roller 281 and the wedge roller 282 are provided in the rotation direction of the combined wafer T at a greater interval than the interval between the divided modification layers M2 as described above. As a result, the fragmented peripheral portion We passes through a space between the wedge roller 281 and the wedge roller 282 to be appropriately dropped down into the discharge duct 302.

Further, the discharge duct 302 has the inclined portion 301b at least from the chuck 71 side immediately below the processing points of the wedge rollers inside the cover body 301. As a result, the fragmented peripheral portion We is dropped down onto the inclined portion 301b of the cover body 301. The dropped peripheral portion We is slid down along the inclined portion 301b, appropriately discharged from the cover body 301 and collected by the collection mechanism 290 via the discharge duct 302.

Here, when the peripheral portion We is separated, it is desirable that the wedge rollers 281 and 282 are inserted into the interface between the processing target wafer W and the support wafer S while avoiding the position where the divided modification layer M2 is formed. When the wedge rollers 281 and 282 are inserted at the position where the divided modification layer M2 is formed, the wedge rollers 281 and 282 may collide with the end portion of the fragmented peripheral portion We, so that the wedge rollers 281 and 282 may be consumed by the impact of the collision. Therefore, by inserting the wedge rollers 281 and 282 while avoiding the formation position of the divided modification layer M2 as described above, it is possible to suppress the consumption of the wedge rollers 281 and 282.

When the peripheral portion We is removed, the static electricity may be generated. However, in the present exemplary embodiment, the ionizer 115 is operated when the peripheral portion We is removed. Thus, the electrostatic charging can be suppressed. Therefore, it is possible to suppress the occurrence of the electrostatic damage caused by the static electricity.

Figure 30E:
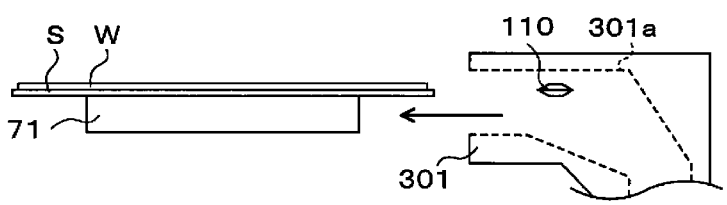

Thereafter, by continuing the rotation of the combined wafer T, the peripheral portion We is removed from the entire circumference of the processing target wafer W. Then, when the peripheral portion We from the entire circumference is collected by the collection container 291 of the collection mechanism 290, the rotation of the combined wafer T by the rotating mechanism 72 is stopped. At the same time, the supply of the fluid from the upper nozzles 113 and the lower nozzles 114, the suction of the inside of the discharge duct 302 by the suction mechanism 293, and the operation of the ionizer 115 are stopped. Further, the wedge rollers are moved to the standby position by the moving mechanism. Then, as shown in FIG. 30E, when the chuck 71 is moved to the delivery position by the moving mechanism 73 and the combined wafer T is carried out from the periphery removing device 270 by the wafer transfer device 80, a series of the edge trim are ended.

Figure 32A:
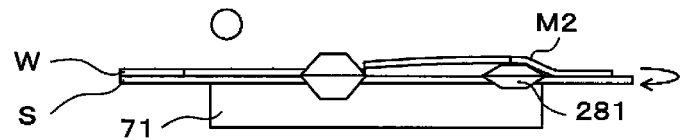
FIG. 32A to FIG. 32D are side views explaining major processes of the edge trim according to the second exemplary embodiment.

If the divided modification layer M2 is not formed appropriately on the processing target wafer W as described above, the peripheral portion We may not be fragmented appropriately by the wedge roller 281 as shown in FIG. 32A. Further, if the peripheral portion We is not fragmented into small pieces, the peripheral portion We may not be collected appropriately by the collection mechanism 290.

Figure 32B:
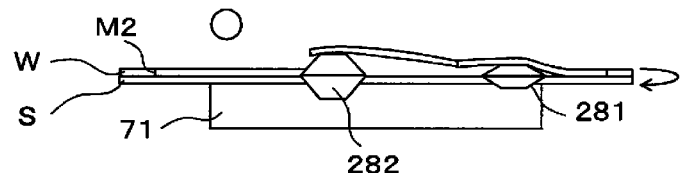

Therefore, in the periphery removing device 270 according to the present exemplary embodiment, the peripheral portion We pushed up by the wedge roller 281 as shown in FIG. 32B is further pushed up by the wedge roller 282. Here, since the wedge roller 282 is larger than the wedge roller 281, the peripheral portion We is peeled off such that the distance between the peripheral portion We and the support wafer S can be further increased.

Figure 32C:
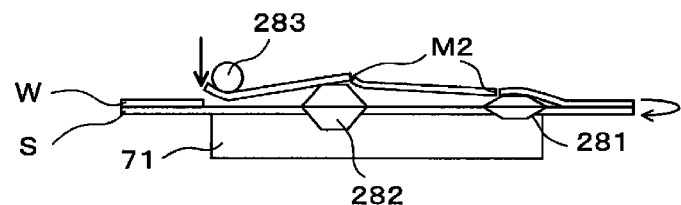

Further, in the periphery removing device 270 according to the present exemplary embodiment, the peripheral portion We pushed up by the wedge roller 282 is pressed toward the support wafer S side by the pressing roller 283 as shown in FIG. 32C. As a result, the peripheral portion We, which has not been fragmented appropriately by the wedge roller 281, is reliably fractured by using the wedge roller 282 as the supporting point.

Figure 32D:
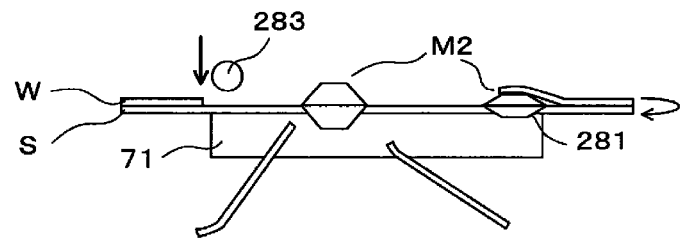

Then, the fragmented peripheral portion We is dropped down to the inside of the cover body 301, specifically, onto the inclined portion 301*b*, as shown in FIG. 32D.

As described above, according to the present exemplary embodiment, even when the peripheral portion We is not fragmented appropriately by the wedge roller 281, the peripheral portion We can be reliably fractured and fragmented starting from the divided modification layer M2.

Further, since the pressing roller 283 is configured to be movable up and down by the elevating mechanism 283*a*, the pressing roller 283 can appropriately press the peripheral portion We from above. Therefore, the peripheral portion We can be appropriately fragmented.

In the present exemplary embodiment, a timing of inserting the wedge roller 282 between the peripheral portion We and the support wafer S can be selected. For example, the wedge roller 282 may be inserted at the same time as the wedge roller 281 is inserted when the edge trim is started. Further, for example, the wedge roller 282 may be inserted appropriately when it is detected that the peripheral portion We has not been appropriately fragmented by the wedge roller 281.

Also, a timing of moving the pressing roller 283 up and down can be determined. For example, the pressing roller 283 may be moved up and down periodically according to the rotation speed of the combined wafer T, or may be moved up and down appropriately when it is detected that the peripheral portion We has not been appropriately divided.

Further, in the above-described edge trim, the particles are generated when the peripheral portion We is fractured as described above. However, in the periphery removing device according to the present exemplary embodiment, the cover body 301 is provided so as to cover the processing points of the wedge rollers 281 and 282 and the pressing roller 283, and, thus, the generated particles are appropriately received by the cover body 301. That is, it is possible to appropriately suppress the scattering of the particles into the device.

Furthermore, according to the present exemplary embodiment, the inside of the discharge mechanism 300 is suctioned by the suction mechanism 293 and the air flow is formed from the cover body 301 to the discharge duct 302. Accordingly, the particles received by the cover body 301 can be appropriately discharged from the inside of the cover body 301 and can be collected by the collection mechanism 290 via the discharge duct 302. That is, it is possible to more appropriately suppress the scattering of the particles into the device.

Moreover, according to the present exemplary embodiment, the fluid is supplied from the upper nozzles 113 and the lower nozzles 114 toward the processing points of the wedge rollers. Thus, it is possible to more appropriately suppress the scattering of the generated particles.

As described above, in the periphery removing device 270 according to the present exemplary embodiment, since the cover body 301 is provided so as to cover the processing points of the wedge rollers of the periphery removing unit 110, it is possible to receive the particles generated when the peripheral portion We is fractured. Thus, it is possible to appropriately suppress the scattering of the generated particles into the device.

Also, inside the discharge mechanism 300, the air flow toward the collection mechanism 290 is formed by the suction mechanism 293, the upper nozzles 113 and the lower nozzles 114. Thus, it is possible to more appropriately suppress the scattering of the particles and collect the particles by the collection mechanism 290.

Further, as shown in FIG. 26, the collection path 301*a* is equipped with an inclined portion on a ceiling surface thereof in addition to the inclined portion 301*b* formed below the wedge roller. Also, since a step portion is not formed in the collection path 301*a* formed inside the cover body 301 as described above, a blowback of the air flow is unlikely to occur. Accordingly, it is possible to more appropriately suppress the scattering of the generated particles into the device.

According to the present exemplary embodiment, the discharge duct 302 serves as a collection path for the peripheral portion We and a collection path for the particles, but the peripheral portion We and the particles may be collected through respective collection paths. In this case, for example, by forming the collection path for the particles narrower than the collection path for the peripheral portion We, the flow velocity of the air flow formed in the collection path for the particles can be increased. That is, it is possible to more appropriately collect the particles.

In the periphery removing device 270 according to the present exemplary embodiment, the peripheral portion We and the support wafer S are appropriately peeled off by the wedge roller 281, and the peripheral portion We is appropriately fragmented along the divided modification layer M2. Therefore, it is possible to appropriately collect the peripheral portion We by the collection mechanism 290.

Even when the peripheral portion We has not been fragmented appropriately from the divided modification layer M2 by the wedge roller 281, the peripheral portion We can be appropriately fragmented by using the wedge roller 282 as the supporting point with the pressing force of the pressing roller 283. That is, it is possible to appropriately remove the peripheral portion We.

Here, an upper end of the wedge roller 282 is located above at least an upper end of the wedge roller 281, specifically, at a position away from the support wafer S, and, thus, the distance between the peripheral portion We and the support wafer S can be further increased as compared to a case when using the wedge roller 281. That is, it becomes easy to more appropriately fracture the peripheral portion We starting from the divided modification layer M2.

Further, the removed peripheral portion We is dropped down into the cover body 301, but since the inclined portion 301b is formed below the wedge roller in the collection path 301a, the removed peripheral portion We can be appropriately collected by the collection mechanism 290.

According to the present exemplary embodiment, two wedge rollers are provided as the insertion member along the rotation direction of the combined wafer T, but the number and the arrangement of wedge rollers are not limited thereto. For example, three or more insertion members may be provided along the rotation direction of the combined wafer T, or only one insertion member may be provided. In any case, by pressing the peripheral portion We, which has been pushed up by the insertion member in the peeling direction, by the pressing roller 283, the peripheral portion We can be appropriately fragmented and removed by using the insertion member as the supporting point.

In the present exemplary embodiment, the peripheral portion We is removed by the periphery removing unit 110 in the periphery removing device 270, but the method of removing the peripheral portion We is not limited thereto. For example, the peripheral portion We may be removed while being held, or the peripheral portion We may be removed by applying a physical impact or ultrasonic waves to the peripheral portion We.

Figure 33:
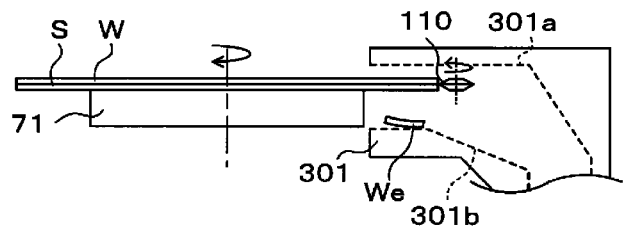
FIG. 33 is an explanatory diagram illustrating a state in which a removed peripheral portion is dropped onto a horizontal portion of a discharge duct.

In the present exemplary embodiment, the combined wafer T is held on the chuck 71 in the horizontal direction, i.e., the in-plane direction of the combined wafer T is set to the horizontal direction. In this case, as shown in FIG. 33, when the removed peripheral portion We is dropped down to the chuck 71 side rather than to the inclined portion 301b, i.e., when it is dropped down to the horizontal portion of the collection path 301a, the peripheral portion We cannot be discharged from the cover body 301.

Figure 34:
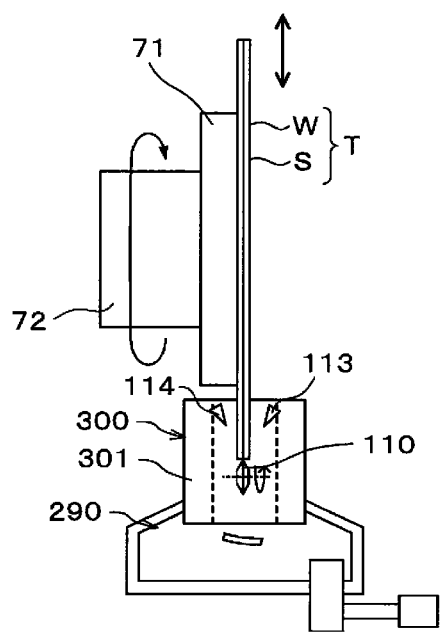
FIG. 34 is an explanatory diagram illustrating an example configuration of the periphery removing device according to the second exemplary embodiment.

Therefore, the combined wafer T may be held on the chuck 71 in the vertical direction as shown in FIG. 34. That is, the in-plane direction of the combined wafer T may be set to the vertical direction. In this case, the periphery removing unit 110, the collection mechanism 290 and the discharge mechanism 300 are provided below the combined wafer T. Further, the peripheral portion We removed by the periphery removing unit 110 is dropped down by its own weight to be collected by the collection mechanism 290. Also, in this example, the cover body 301 of the discharge mechanism 300 is provided so as to cover the processing point in order to suppress the scattering of the particles generated when the peripheral portion We is removed. Also, in the present exemplary embodiment, the fluid is supplied from the upper nozzle 113 and the lower nozzle 114 toward the processing point, and, thus, it is possible to more appropriately suppress the scattering of the particles. In this case, the discharge duct 302 may be omitted depending on the device configuration.

Further, the periphery removing device 270 may be equipped with an inclining mechanism 310 configured to change the in-plane direction of the combined wafer T to be carried in and out. With the inclining mechanism 310, the in-plane direction of the combined wafer T to be carried in is changed from the horizontal direction and the in-plane direction of the combined wafer T to be carried out is returned to the horizontal direction.

Figure 35A:
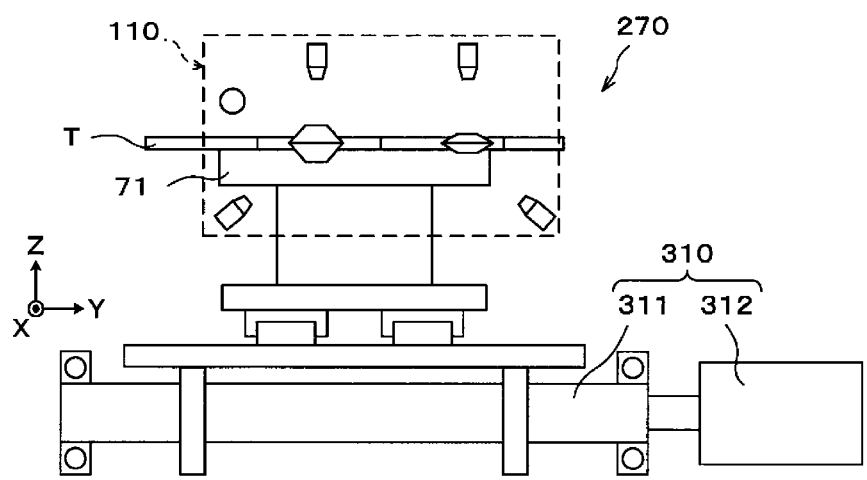
FIG. 35A and FIG. 35B are explanatory diagrams illustrating an example configuration of the periphery removing device according to the second exemplary embodiment.
Figure 35B:
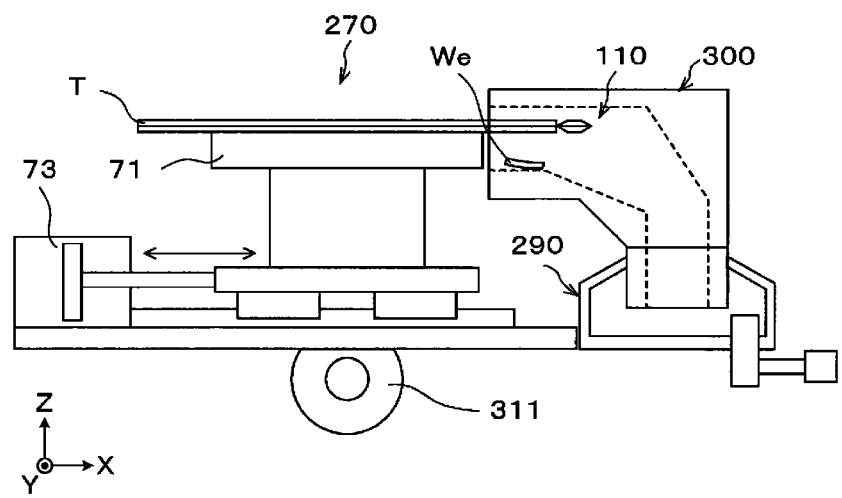

As shown in FIG. 35A and FIG. 35B, the inclining mechanism 310 is provided below the periphery removing device 270 and has a servo motor 312 configured to rotate the periphery removing device 270 around a rotating roller 311.

Figure 36:
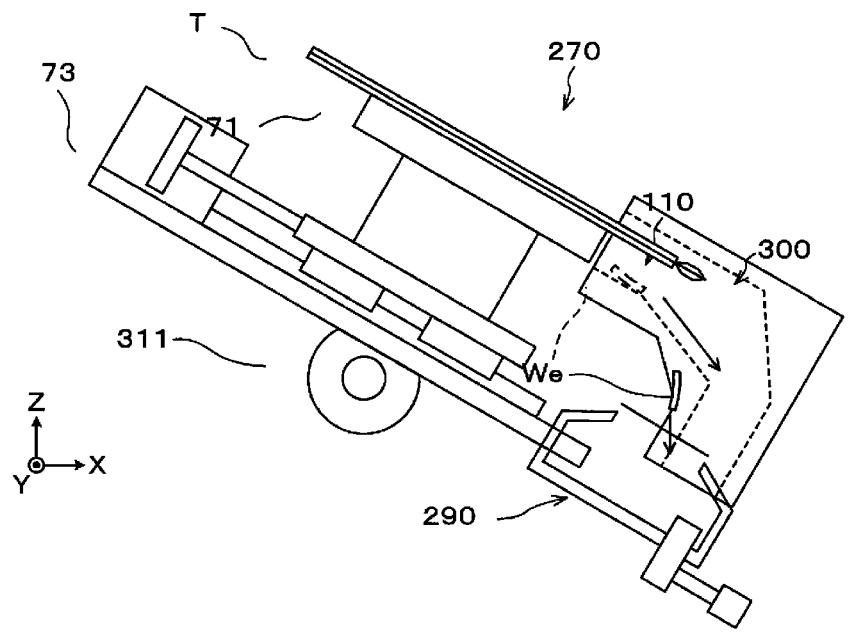
FIG. 36 is an explanatory diagram illustrating an example operation of the periphery removing device illustrated in FIG. 35A and FIG. 35B.

The inclining mechanism 310 rotates the periphery removing device 270 around the rotating roller 311 by operating the servo motor 312, as shown in FIG. 36. That is, the in-plane direction of the combined wafer T is changed. The rotation direction of the periphery removing device 270 is, for example, a direction in which the peripheral portion We that has been dropped down to the horizontal portion of the discharge duct 302 is collected by the collection mechanism 290.

In the periphery removing device 270 according to the present exemplary embodiment, by inclining the periphery removing device 270, even if the peripheral portion We is dropped down to the horizontal portion of the collection path 301a as described above, the peripheral portion We can be appropriately collected by the collection mechanism 290.

The inclining mechanism 310 can be operated at any timing. For example, as described above, the inclining mechanism 310 may be operated when it is detected that the peripheral portion We has been dropped down to the horizontal portion of the collection path 301a, or the inclining mechanism 310 may be operated when the edge trim is started so that the device may be inclined while the edge trim is performed in the periphery removing device 270.

Figure 37:
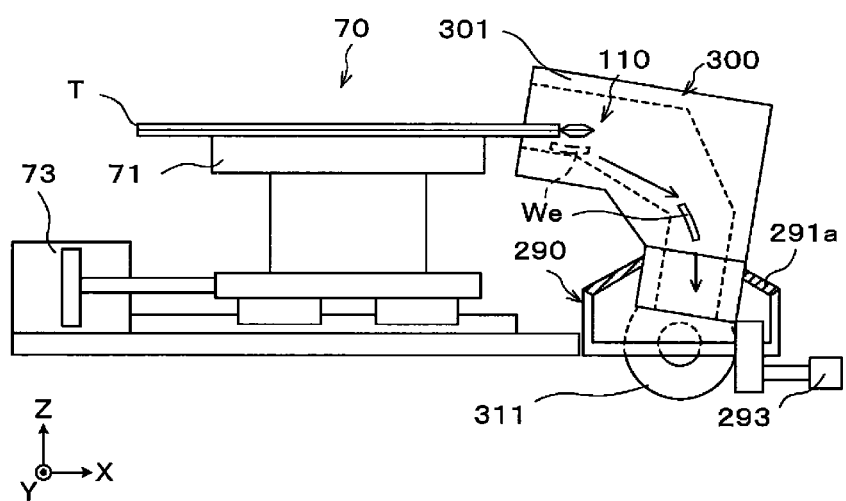
FIG. 37 is an explanatory diagram illustrating an example operation of the periphery removing device illustrated in FIG. 35A and FIG. 35B.

According to the present exemplary embodiment, the inclining mechanism 310 is configured to incline the entire periphery removing device 270, but as shown in FIG. 37, if the inclining mechanism 310 can incline at least the discharge mechanism 300, the peripheral portion We dropped down to the horizontal portion can be collected. More specifically, the inclining mechanism 310 just needs to incline at least the cover body 301.

When the discharge mechanism 300 is inclined in this manner, it is desirable that an upper portion 291a of the collection container 291 is formed of a flexible material such as rubber or sheet-shaped molding resin. With this configuration, the upper portion 291a expands and contracts as the cover body 301 is inclined. Thus, the inside of the collection container 291 can be appropriately maintained in a decompressed space by the suction of the suction mechanism 293.

Figure 38A:
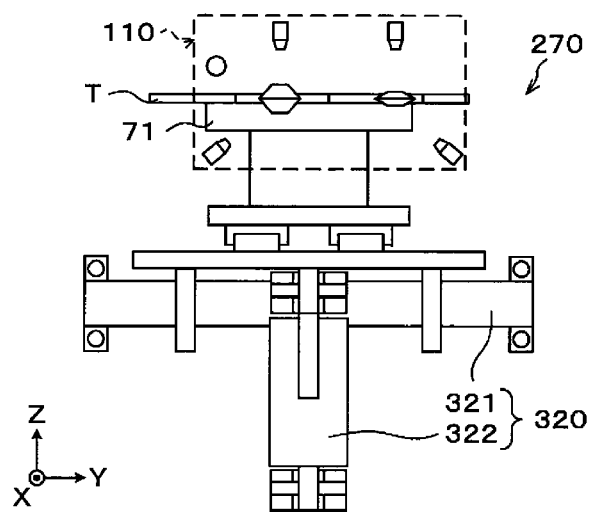
FIG. 38A and FIG. 38B are explanatory diagrams illustrating an example configuration of the periphery removing device according to the second exemplary embodiment.
Figure 38B:
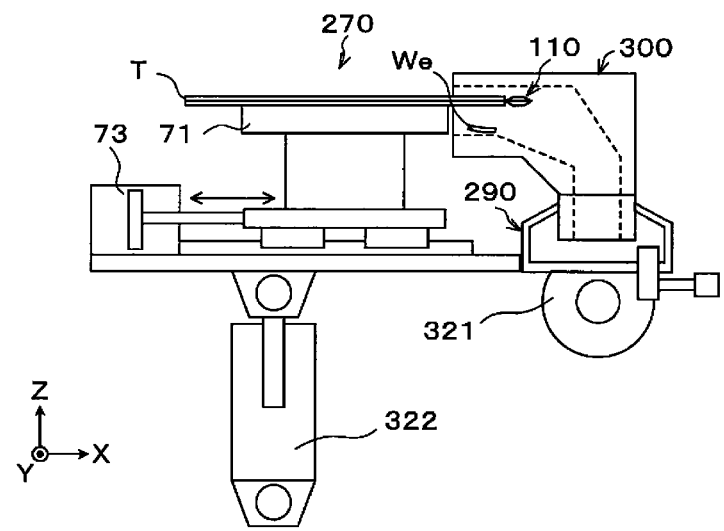

The configuration of the collection mechanism is not limited to this example. For example, as shown in FIG. 38A and FIG. 38B, an inclining mechanism 320 may include a rotating roller 321 and an air cylinder 322. In the illustrated example, the rotating roller 321 is provided below the periphery removing unit 110 and the air cylinder 322 is provided below the chuck 71.

Figure 39:
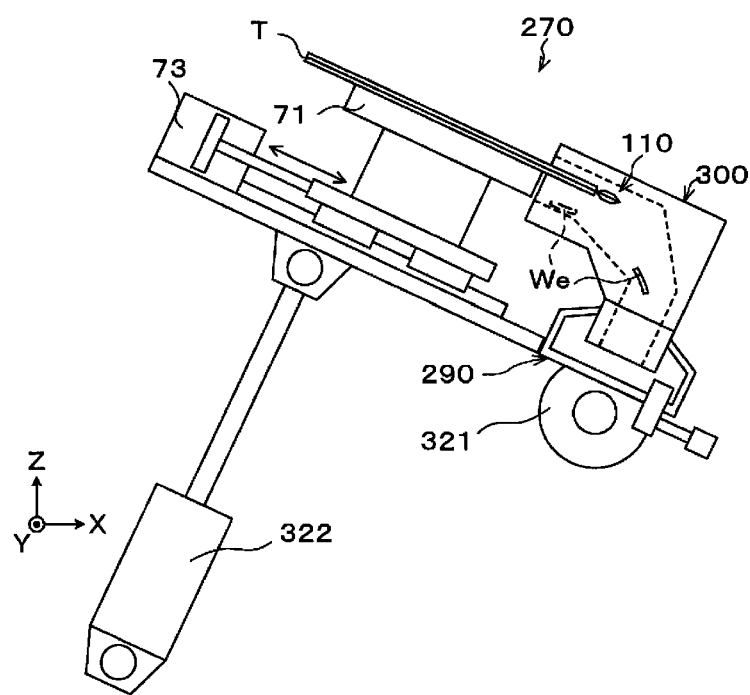
FIG. 39 is an explanatory diagram illustrating an example operation of the periphery removing device illustrated in FIG. 38A and FIG. 38B.

In the inclining mechanism 320, the chuck 71 of the periphery removing device 270 is pushed up by an operation of the air cylinder 322, which causes the periphery removing device 270 to rotate around the rotating roller 321 as shown in FIG. 39. That is, the in-plane direction of the combined wafer T is changed. The rotation direction of the periphery removing device 270 is, for example, a direction in which the peripheral portion We that has been dropped down to the horizontal portion of the discharge duct 302 is collected by the collection mechanism 290.

According to the first and second exemplary embodiments described above, the processing target wafer W is thinned by performing the rough grinding, the intermediate grinding and the finish grinding on the rear surface Wb of the processing target wafer W in the processing device 90. However, the method of thinning the processing target wafer W is not limited thereto. For example, the processing target wafer W may be thinned by forming an inner surface modification layer M3, from which the peeling-off is started, along an in-plane direction inside the processing target wafer W. Hereinafter, a case where the inner surface modification layer M3 is formed inside the processing target wafer W and the peeling is performed will be described with reference to the accompanying drawings.

Figure 40A:
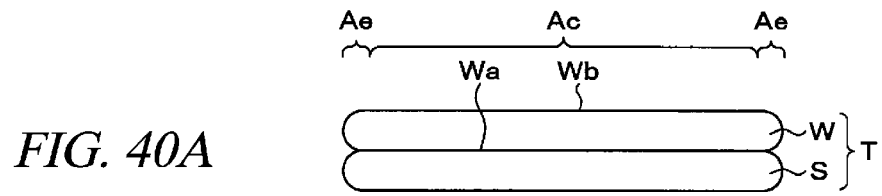
FIG. 40A to FIG. 40F are explanatory diagrams illustrating major processes of the wafer processing.

First, the cassette Ct that accommodates the plurality of combined wafers T shown in FIG. 40A is placed on the cassette mounting table 10 of the carry-in/out station 2. As in the above-described exemplary embodiments, a bonding region Ac and a non-bonding region Ae are formed on the combined wafer T.

Figure 40B:
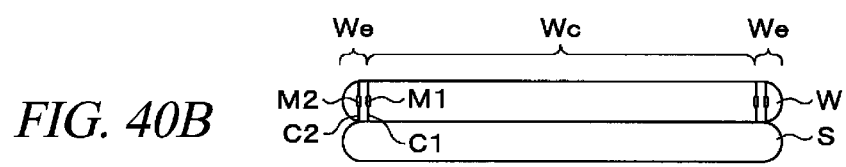
Figure 40C:
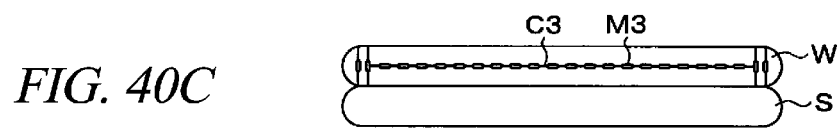
Figure 41:
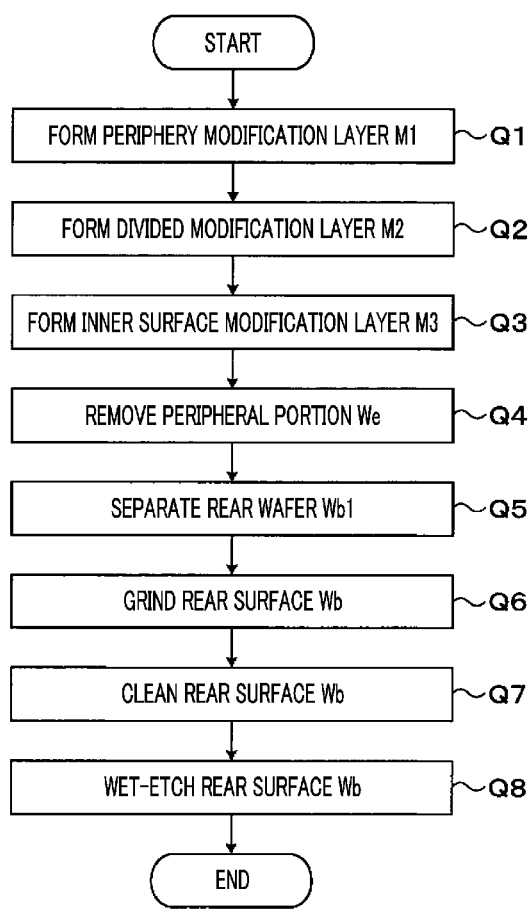
FIG. 41 is a flowchart illustrating major processes of the wafer processing.

Then, the combined wafer T in the cassette Ct is taken out by the wafer transfer device 20 and transferred to the transition device 30. Subsequently, the wafer transfer device 50 takes out the combined wafer T of the transition device 30 and transfers it to the modifying device 60. In the modifying device 60, as shown in FIG. 40B and FIG. 5B, the periphery modification layer M1 and the divided modification layer M2 are sequentially formed inside the processing target wafer W (processes Q1 and Q2 in FIG. 41), and as shown in FIG. 40C, the inner surface modification layer M3 is formed (process Q3 in FIG. 41). The periphery modification layer M1 serves as a starting point when the peripheral portion We is removed during the edge trim. The divided modification layer M2 serves as a starting point for fragmenting the peripheral portion We to be removed. The inner surface modification layer M3 serves as a starting point for thinning the processing target wafer W. Inside the processing target wafer W, cracks C1 and C2 develop from the periphery modification layer M1 and the divided modification layer M2 and reach the rear surface Wb and the front surface Wa, respectively. Further, a crack C3 develops in an in-plane direction from the inner surface modification layer M3.

As described above, in the modifying device 60, the periphery modification layer M1 is formed at the boundary between the peripheral portion We and the central portion Wc of the processing target wafer W, and in this state, the peripheral portion We and the central portion Wc are still connected to each other.

After the periphery modification layer M1, the divided modification layer M2 and the inner surface modification layer M3 are formed on the processing target wafer W, the combined wafer T is carried out from the modifying device 60 by the wafer transfer device 80.

Figure 40D:
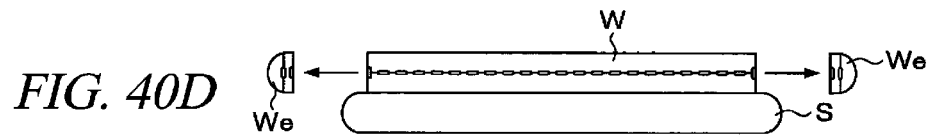

Then, the combined wafer T is transferred to the periphery removing device 70 by the wafer transfer device 80. In the periphery removing device 70, as shown in FIG. 40D, the peripheral portion We of the processing target wafer W is removed, starting from the periphery modification layer M1, by fracturing the connected portion between the peripheral portion We and the central portion Wc (process Q4 in FIG. 41). Here, the peripheral portion We is fragmented starting from the divided modification layer M2. The edge trim in the periphery removing device 70 is performed by any method shown in the above-described first exemplary embodiment or second exemplary embodiment.

Figure 40E:
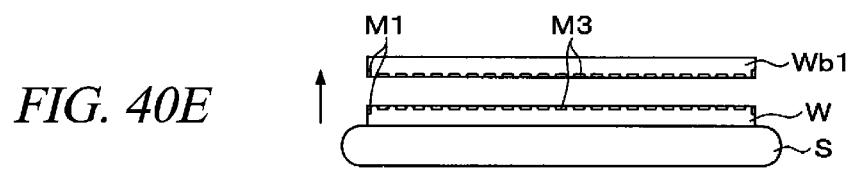

Thereafter, the combined wafer T is transferred into the processing device 90 by the wafer transfer device 80. In the processing device 90, the combined wafer T is delivered from the transfer arm 81 to the chuck 96 located at the delivery position A0. Here, as shown in FIG. 40E, a side of the rear surface Wb of the processing target wafer W (hereinafter, referred to as "rear wafer Wb1") is separated starting from the inner surface modification layer M3 (process Q5 in FIG. 41).

In the process Q5, while the processing target wafer W is suctioned and held by the transfer arm 81, the support wafer S is suctioned and held by the chuck 96. In this state, when the transfer arm 81 is rotated, the rear wafer Wb1 is cut starting from the inner surface modification layer M3. Thereafter, while the transfer arm 81 suctions and holds the rear wafer Wb1, the transfer arm 81 is moved up to separate the rear wafer Wb1 from the processing target wafer W. Here, for example, a pressure sensor (not shown) measures a pressure for suctioning the rear wafer Wb1 to detect the presence or absence of the rear wafer Wb1 and check whether or not the rear wafer Wb1 has been separated from the processing target wafer W. The separated rear wafer Wb1 is collected by a collection unit (not shown) provided outside the wafer processing system 1.

Figure 40F:
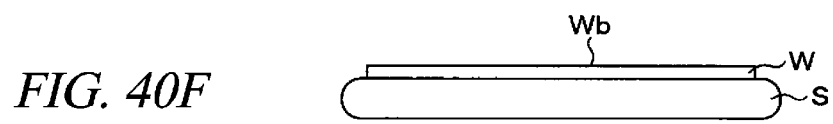

Subsequently, the chuck 96 is moved to the processing position A3 by rotating the turntable 91. Then, as shown in FIG. 40F, the rear surface Wb of the processing target wafer W held by the chuck 96 is ground by the finish grinding unit 94 to remove the inner surface modification layer M3 and the periphery modification layer M1 remaining on the rear surface Wb (process Q6 in FIG. 41). In the process Q6, in a state where the rear surface Wb is in contact with the grinding whetstone, each of the processing target wafer W and the grinding whetstone is rotated to grind the rear surface Wb. Thereafter, the rear surface Wb of the processing target wafer W may be cleaned with the cleaning solution by using the cleaning solution nozzle (not shown).

Then, the combined wafer T is transferred into the cleaning device 41 by the wafer transfer device 80. In the cleaning device 41, the rear surface Wb, which is the grinding surface of the processing target wafer W, is scrub-cleaned (process Q7 in FIG. 41). Further, in the cleaning device 41, the rear surface Sb of the support wafer S may be cleaned together with the rear surface Wb of the processing target wafer W.

Then, the combined wafer T is transferred into the etching device 40 by the wafer transfer device 50. In the etching device 40, the rear surface Wb, which is the grinding surface of the processing target wafer W, is wet etched with a chemical solution (process Q8 in FIG. 41). A grinding mark may be formed on the rear surface Wb ground by the above-described processing device 90. In the present process Q8, the grinding mark can be removed by the wet etching, and, thus, the rear surface Wb can be smoothed.

Thereafter, the combined wafer T which has undergone all the processings is transferred into the transition device 30 by the wafer transfer device 50 and then transferred to the cassette Ct of the cassette mounting table 10 by the wafer transfer device 20. In this way, a series of processings in the wafer processing system 1 are ended.

As described above, if the processing device 90 separates the processing target wafer W starting from the inner surface modification layer M3 to perform the thinning to the level equivalent to the thinning amount of by the rough grinding and the intermediate grinding as in the first exemplary embodiment, the processing device 90 can be configured with one shaft only for the finish grinding unit 94. That is, the device configuration can be further simplified. Here, the arrangement of the finish grinding unit 94 can be determined at any of the processing positions A1, A2 and A3 shown in FIG. 1.

The exemplary embodiments disclosed herein are illustrative in all aspects and do not limit the present disclosure. The above-described exemplary embodiments may be omitted, substituted, or changed in various forms without departing from the scope and spirit of the appended claims.

EXPLANATION OF REFERENCE NUMERALS

According to the present disclosure, it is possible to remove and appropriately collect a peripheral portion of one substrate in a combined substrate including substrates bonded to each other.

We claim:

1. A substrate processing apparatus configured to process a substrate, comprising:
    a substrate holder configured to hold, in a combined substrate in which a first substrate and a second substrate are bonded to each other, the second substrate;
    a laser head configured to form a periphery modification layer in the first substrate along a boundary between a peripheral portion to be removed and a central portion of the first substrate by radiating a laser beam into the first substrate;
    an insertion member having a shape in which a width of the insertion member decreases diametrically outwards when viewed from a side and configured to rotate about a vertical axis, and configured to be inserted between the first substrate and the second substrate and remove, starting from the periphery modification layer formed in the first substrate, the peripheral portion from the combined substrate held by the substrate holder; and
    a collection unit equipped with a collection tray configured to collect the peripheral portion removed by the insertion member.

2. The substrate processing apparatus of claim 1, wherein the collection unit is equipped with a weight measurement device configured to measure a weight of the collection tray.

3. The substrate processing apparatus of claim 1, wherein the collection unit is equipped with a crushing roller configured to crush the peripheral portion collected from the insertion member by the collection tray.

4. The substrate processing apparatus of claim 1, wherein the collection unit is equipped with a buffer tray configured to accommodate the peripheral portion collected from the insertion member by the collection tray.

5. The substrate processing apparatus of claim 1, wherein the collection unit is equipped with a discharge mechanism configured to discharge particles generated when the peripheral portion is removed, and wherein the discharge mechanism includes: a cover body, in which the insertion member is provided, configured to receive the particles; and a discharge duct configured to discharge the particles from the cover body.

6. The substrate processing apparatus of claim 5, wherein the collection tray is connected to the discharge duct, and the collection tray is configured to collect the peripheral portion, which is removed by the insertion member and received by the cover body, and the particles received by the cover body.

7. The substrate processing apparatus of claim 1, wherein the collection tray includes multiple collection trays allowed to be replaced.

8. The substrate processing apparatus of claim 1, wherein the insertion member removes the peripheral portion by applying an impact to the peripheral portion.

9. The substrate processing apparatus of claim 8, wherein the insertion member is a roller.

10. The substrate processing apparatus of claim 8, further comprising: a rotating mechanism configured to rotate the substrate holder; and a pressing roller configured to press the peripheral portion, which is peeled from the second substrate by the insertion member, in a direction toward the second substrate.

11. The substrate processing apparatus of claim 1, wherein a distance between an outer end portion of the combined substrate and the insertion member is allowed to be adjusted.

12. The substrate processing apparatus of claim 1, wherein the insertion member is equipped with a buffer tray configured to absorb an impact caused when inserted into an interface between the first substrate and the second substrate.

13. The substrate processing apparatus of claim 8, further comprising: a rotating mechanism configured to rotate the substrate holder, wherein the insertion member removes the peripheral portion by applying an impact to the peripheral portion while the first substrate is rotated by the rotating mechanism.

14. The substrate processing apparatus of claim 1, wherein the substrate holder holds the combined substrate in a state where an in-plane direction of the combined substrate is set to a vertical direction.

15. The substrate processing apparatus of claim 1, further comprising: a sensor configured to detect presence or absence of the peripheral portion in the first substrate which is held by the substrate holder and from which the peripheral portion is removed by the insertion member.

16. The substrate processing apparatus of claim 1, further comprising: a fluid supply configured to supply a fluid to the first substrate in the combined substrate held by the substrate holder.

17. The substrate processing apparatus of claim 1, further comprising: an ionizer configured to suppress electrostatic charging when the peripheral portion is removed.

18. A substrate processing method of processing a substrate, comprising:
    holding, in a combined substrate in which a first substrate and a second substrate are bonded to each other, the second substrate by a substrate holder;
    forming a periphery modification layer in the first substrate along a boundary between a peripheral portion to be removed and a central portion of the first substrate by radiating a laser beam into the first substrate;
    removing, starting from the periphery modification layer, the peripheral portion from the combined substrate held by the substrate holder by an insertion member having a shape in which a width of the insertion member decreases diametrically outwards when viewed from a side and configured to rotate about a vertical axis, and configured to be inserted between the first substrate and the second substrate; and
    collecting the peripheral portion removed by the insertion member.

19. The substrate processing method of claim 18, wherein particles generated in the removing of the peripheral portion are guided to a discharge duct by a cover body having therein the insertion member configured to remove the peripheral portion, and then, discharged from a discharge mechanism through the discharge duct.

\* \* \* \* \*